(12) United States Patent
Maeno

(10) Patent No.: US 6,516,431 B1
(45) Date of Patent: Feb. 4, 2003

(54) SEMICONDUCTOR DEVICE

(75) Inventor: Hideshi Maeno, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/457,396

(22) Filed: Dec. 9, 1999

(30) Foreign Application Priority Data

Jun. 28, 1999 (JP) .............................. 11-181394

(51) Int. Cl.[7] .......................... G01R 31/28; H03K 19/00
(52) U.S. Cl. .......................................... 714/726; 326/16
(58) Field of Search ................... 714/702, 726, 714/729; 326/16

(56) References Cited

U.S. PATENT DOCUMENTS

| | | | | |
|---|---|---|---|---|
| 4,926,424 A | * | 5/1990 | Maeno | ............ 714/719 |
| 5,771,194 A | | 6/1998 | Maeno | |
| 5,815,512 A | * | 9/1998 | Osawa et al. | ............ 365/201 |
| 5,848,074 A | | 12/1998 | Maeno | |

* cited by examiner

*Primary Examiner*—Albert DeCady
*Assistant Examiner*—Matthew Dooley
(74) *Attorney, Agent, or Firm*—Oblon, Spivak, McClelland, Maier & Neustadt, P.C.

(57) ABSTRACT

A semiconductor device comprising a memory circuit, a switch for relieving the memory circuit of its failures, and a logic circuit to be tested, facilitates a test of the logic circuit. When a switch control signal (SET) is "1", for example, a switch (200) selects predetermined 1-bit data (=c) from a plurality of 1-bit data (=b) outputted in parallel form from a RAM (100) and outputs it to a logic circuit (300), where c<b.

10 Claims, 32 Drawing Sheets

F I G. 12
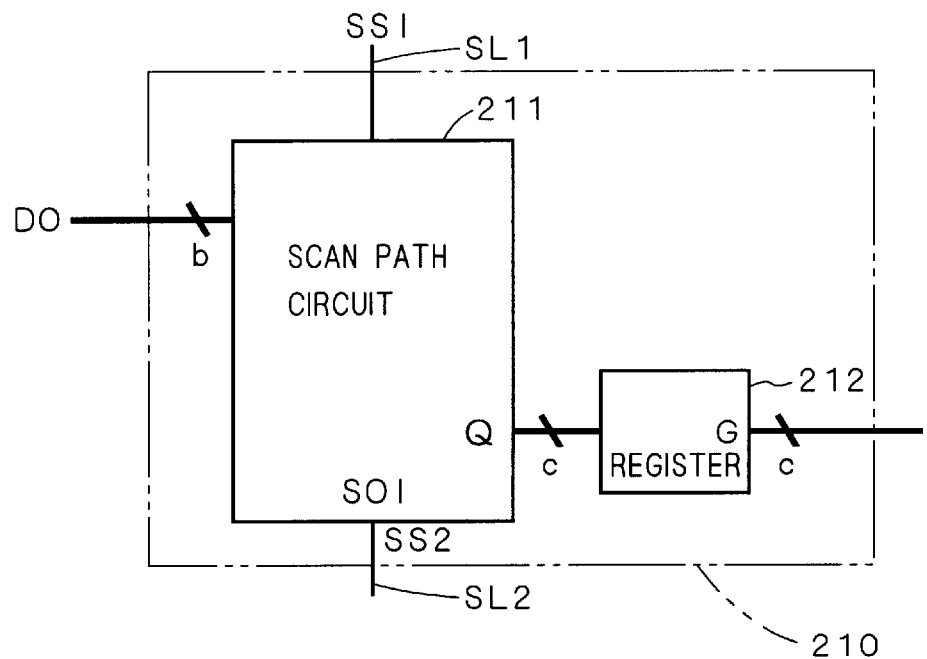
F I G. 13
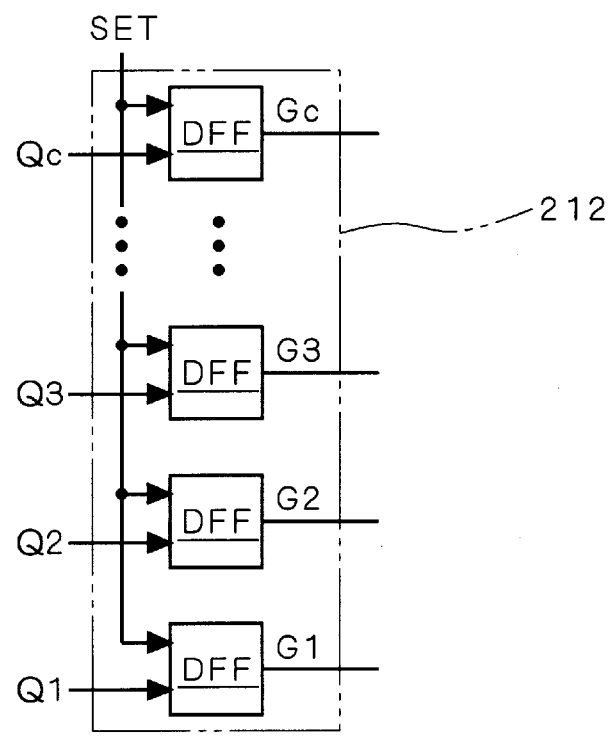

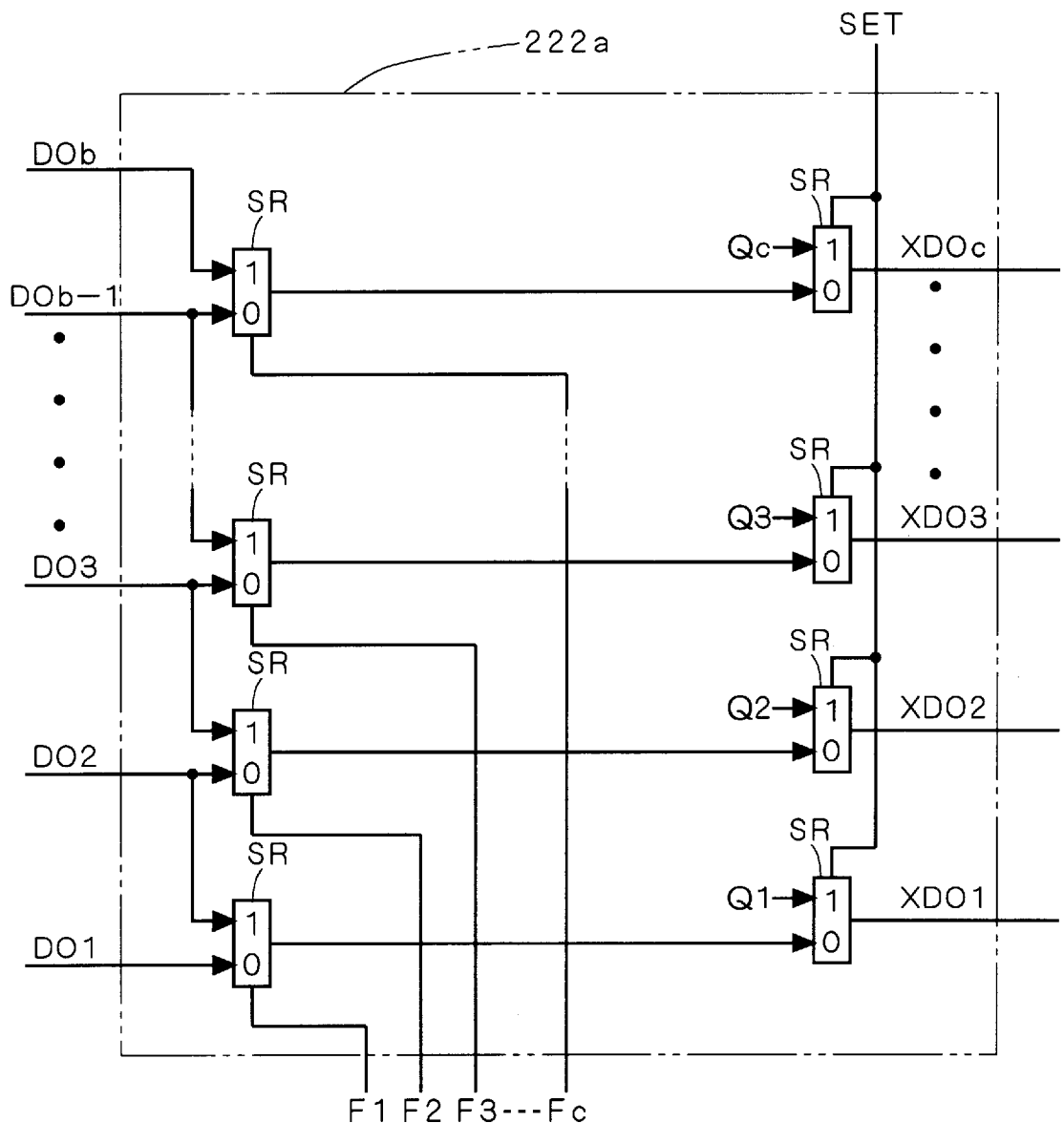
F I G. 22

F I G. 26
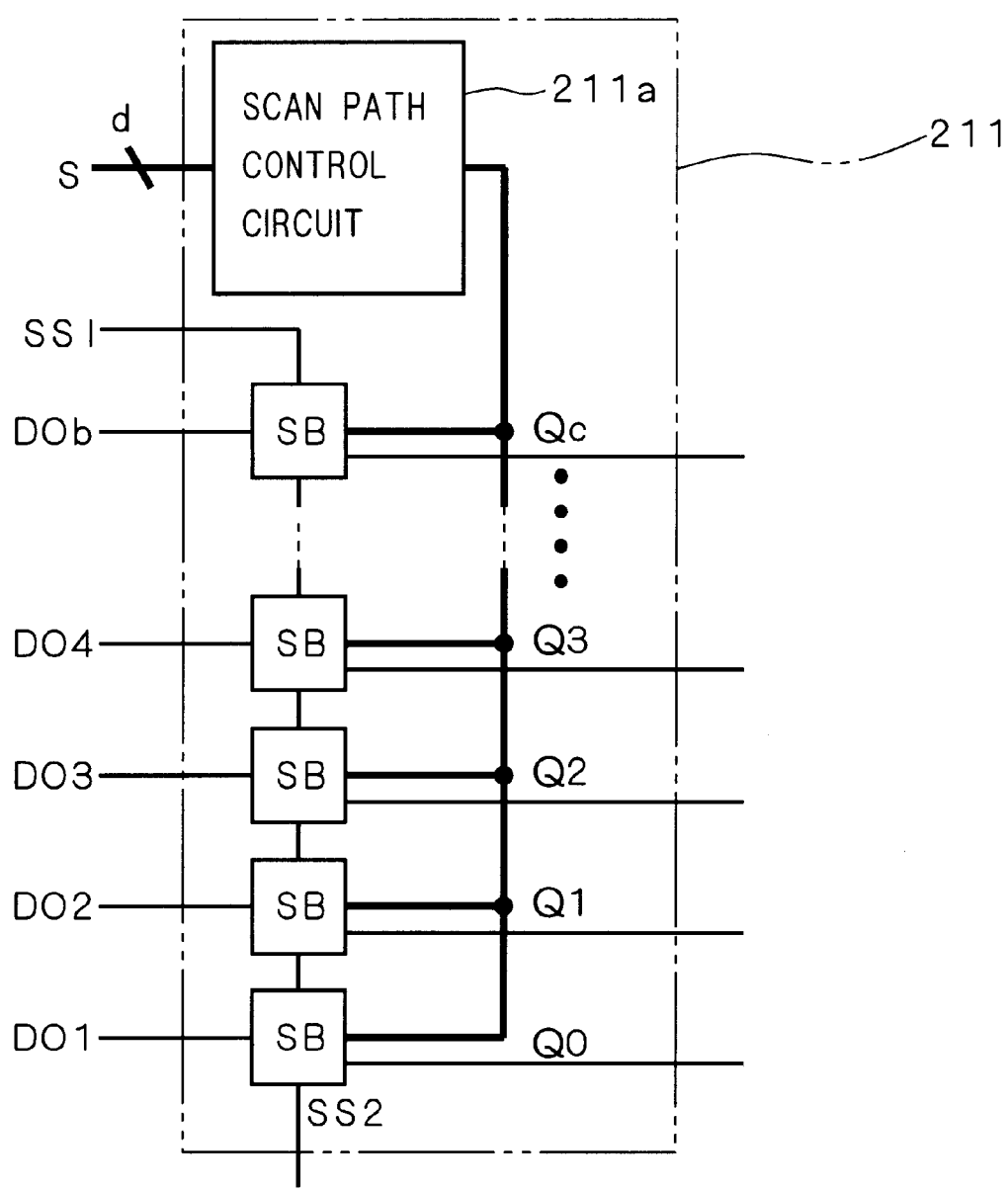

SEMICONDUCTOR DEVICE

BACKGROUND OF THE INVENTION

The present invention relates to a semiconductor device comprising a switch such as a redundancy circuit for relieving a random access memory (RAM) of its failures.

DESCRIPTION OF THE BACKGROUND ART

FIG. 47 is a circuit diagram of a conventional semiconductor device. The conventional semiconductor device comprises a 5-bit word mode RAM 100, a scan path circuit 210*a*, a failure relief circuit 220*a*, and a logic circuit 300. The RAM 100 and the logic circuit 300 exchange data therebetween through the failure relief circuit 220*a*. A detailed description of the scan path circuit 210*a* and the failure relief circuit 220*a* is given for example in Japanese Patent Laid-open No. P08-94718A.

The scan path circuit 210*a* receives and holds 5-bit data transmitted over lines L1 through L5, rewrites 5-bit data therein on the basis of serial data SS1 from a line L19, and outputs 5-bit data therein as serial data SS2 to a line L20. The scan path circuit 210*a* also outputs 4 bits of 5-bit data therein in parallel form as 1-bit data G1 through G4.

Whether or not there is an error in the data transmitted over the lines L1 through L5 can be checked by looking up the serial data SS2 from the scan path circuit 210*a*, so the RAM 100 can be tested for failure.

The scan path circuit 210*a* and the failure relief circuit 220*a* serve as a redundancy circuit for relieving the RAM 100 of its failures. For example, if there is an error in the third bit of the RAM 100, the serial data SS1 on the line L19 is set properly so that the 1-bit data G1 through G4 are set to "1", "1", "0", "1", respectively. This provides connections between the lines L11 and L1, between the lines L12 and L2, between the lines L13 and L4, and between the lines L14 and L5, except the line L3 of trouble. Similarly, connections are made between lines L15 and L6, between a line L16 and lines L7, L8, between lines L17 and L9, and between lines L18 and L10. Thus, even if the RAM 100 contains such a failure bit, it can be used as a trouble-free 4-bit word mode RAM, when viewed from the logic circuit 300, by making connections between the lines L1 through L10, except a trouble line, and the lines L11 through L18.

However, since the lines L11 through L14 are connected to four lines selected from among the five lines L1 through L5 according to data on the lines L1 through L5 and on the line L19, and since the data on the lines L1 through L5 may not be correct due to a failure in the RAM 100, it would be considerably difficult for the failure relief circuit 220*a* to determine which of the lines L11 through L14 each data on the lines L1 through L5 is transmitted to.

The above problem offers a considerable difficulty in testing the logic circuit 300. For example, a predetermined expected value is stored into the RAM 100 at every address and applied to the logic circuit 300 through the failure relief circuit 220*a*. This enables the test of whether the logic circuit 300 operates as intended or not. In such a test, which of the lines L11 through L14 each expected value on the lines L1 through L5 is transmitted to has to be determined from the expected value itself. However, if a failure occurs in the RAM 100, this determination becomes hard to be made, and thus, a serious difficulty arises in the test of the logic circuit 300.

SUMMARY OF THE INVENTION

A first aspect of the present invention is directed to a semiconductor device comprising: a memory circuit outputting N-bit data (N≧2) in parallel form; a switch including a data holding circuit having a scan path circuit receiving and holding the N-bit data from the memory circuit, the switch receiving a switch control signal and selecting and outputting M-bit data (M<N) from the N-bit data of the memory circuit, the M-bit data outputted from the switch being predetermined M-bit data out of the N-bit data from the memory circuit if the switch control signal satisfies a predetermined condition, and being M-bit data determined according to data held in the data holding circuit if the switch control signal does not satisfy the predetermined condition; and a logic circuit to be tested, receiving the M-bit data outputted from the switch.

According to a second aspect of the present invention, in the semiconductor device of the first aspect, the switch selects and outputs M-bit data directly outputted from the memory circuit.

According to a third aspect of the present invention, in the semiconductor device of the first aspect, the switch selects and outputs M-bit data in the scan path circuit from the memory circuit.

According to a fourth aspect of the present invention, in the semiconductor device of the first aspect, the switch further includes a selector block for selecting and outputting M-bit data from the memory circuit if the switch control signal satisfies the predetermined condition and for selecting and outputting M-bit data from the scan path circuit if the switch control signal does not satisfy the predetermined condition.

According to a fifth aspect of the present invention, in the semiconductor device of the first aspect, the data holding circuit further includes a register for holding data outputted from the scan path circuit.

According to a sixth aspect of the present invention, in the semiconductor device of the fifth aspect, if the switch control signal satisfies the predetermined condition, the register resets data held therein with a predetermined value.

According to a seventh aspect of the present invention, in the semiconductor device of the first aspect, the scan path circuit includes a plurality of series-connected scan path blocks, each of the plurality of scan path blocks having a comparator and receiving 1-bit data from expected data and resetting data held therein with a predetermined value according to a comparison result between the 1-bit data from the expected data and the 1-bit data from the memory circuit.

According to an eighth aspect of the present invention, in the semiconductor device of the first aspect, each of the plurality of scan path blocks resets data held therein with another predetermined value, if the switch control signal satisfies the predetermined condition.

According to a ninth aspect of the present invention, in the semiconductor device of the seventh aspect, each of the plurality of scan path blocks includes a selector for selecting either 1-bit data held therein or serial data from an ante-stage scan path block and for outputting the selected data to a post-stage scan path block.

According to a tenth aspect of the present invention, in the semiconductor device of the seventh aspect, the data holding circuit further includes a register for holding data outputted from the scan path circuit; each of the plurality of scan path blocks changes the comparison result into a predetermined value according to 1-bit data from the register.

In accordance with the first aspect, if the switch control signal satisfies a predetermined condition, the switch selects and outputs predetermined M-bit data out of the N-bit data from the memory circuit. This eliminates the need for determining a signal transmission path to which the data is transmitted according to the data held in the data holding circuit, thus facilitating a test of the logic circuit using the scan path circuit and the memory circuit.

In accordance with the second aspect, the logic circuit can be tested using the M-bit data outputted from the memory circuit.

In accordance with the third aspect, the logic circuit can be tested using the data outputted from the scan path circuit.

In accordance with the fourth aspect, the switch can be composed of the data holding circuit and the selector blocks.

In accordance with the fifth aspect, if the switch control signal does not satisfy a predetermined condition, the switch selects and outputs data corresponding to the data held in the register independently of the data held in the scan path circuit.

In accordance with the sixth aspect, the operation of the switch can be achieved through the use of the register.

In accordance with the seventh aspect, a failure in the memory circuit can be detected.

In accordance with the eighth aspect, the operation of the switch can be achieved through the use of the scan path circuit.

In accordance with the ninth aspect, it is possible to determine whether or not the memory circuit can be relieved of its failures.

In accordance with the tenth aspect, it is possible to determine whether or not the memory circuit can be relieved of its failures.

An object of the present invention is to provide a semiconductor device that can solve the aforementioned conventional problem and has no need for determining a signal transmission path to which data is transmitted according to the data.

These and other objects, features, aspects and advantages of the present invention will become more apparent from the following detailed description of the present invention when taken in conjunction with the accompanying drawings.

BRIEF DESCRIPTION OF THE DRAWINGS

FIG. 12 is a circuit diagram of a data holding circuit according to a second preferred embodiment of the present invention.

FIGS. 13 and 14 are circuit diagrams of registers according to the second preferred embodiment of the present invention.

FIGS. 22 and 24 are circuit diagrams of output selector blocks according to the fourth preferred embodiment of the present invention.

FIGS. 26 and 27 are circuit diagrams of scan path circuits according to a fifth preferred embodiment of the present invention.

DESCRIPTION OF THE PREFERRED EMBODIMENTS

Concept of the Invention

Figure 1:
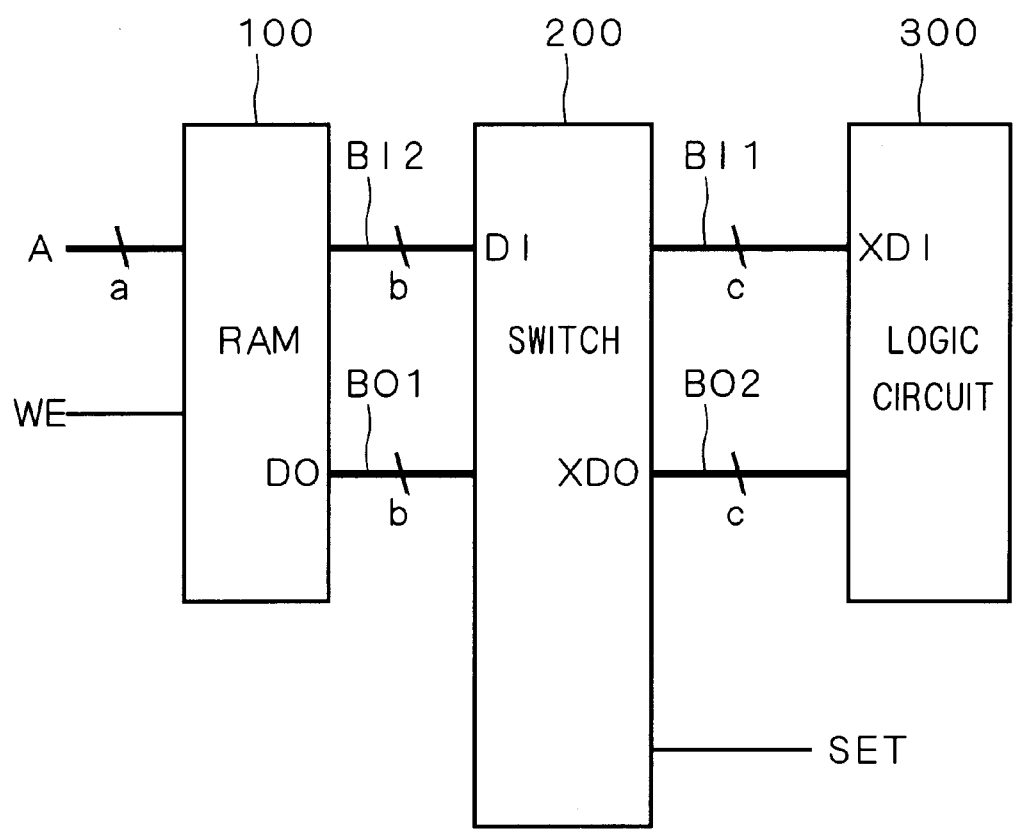
FIG. 1 is a circuit diagram of a semiconductor device according to the present invention.

FIG. 1 is a circuit diagram of a semiconductor device according to the present invention. The device comprises a RAM (memory circuit) 100, a switch 200, a logic circuit (to be tested) 300, and data buses BO1, BO2, BI1, and BI2, all of which are herein formed on a single chip.

The RAM 100 is connected to the data buses BI2, BO1 and receives a write enabling signal WE and an a-bit address signal A. Here the bus is a bundle of lines, and each of the data buses BI2 and BO1 consists of b lines.

When the write enabling signal WE indicates reading of data, the RAM 100 reads out data DO stored at an address indicated by the address signal A and outputs it in parallel form to the data bus BO1. When the write enabling signal WE indicates writing of data, the RAM 100 receives data DI from the data bus BI2 and writes it to an address indicated by the address signal A.

The logic circuit 300 is, for example, comprised of a sequential circuit or a combinational circuit, and connected to the data buses BI1 and BO2. It receives data XDO from the data bus BO2 and outputs data XDI to the data bus BI1. Each of the data buses BO2 and BI1 consists of c lines.

In the following first preferred embodiment, a relation between c and b is for example expressed as c=b−1.

The switch 200 is connected to the data buses BI2, BI1, BO1, BO2 and receives a switch control signal SET. It also receives data from the data buses (first signal transmission paths) BO1, BI1 and outputs data to either of the data buses (second signal transmission paths) BO2 and BI2 corresponding to the above input data value. However, if the switch control signal SET satisfies a predetermined condition such as a value of "1", the switch 200 outputs data to a predetermined line of the data buses BO2 and BI2 independently of the data from the buses BO1 and BI1. This eliminates the need for determining a line to which data is transmitted according to the data, thus considerably facilitating the test of the semiconductor device. Now, preferred embodiments of the present invention are described.

First Preferred Embodiment

Figure 2:
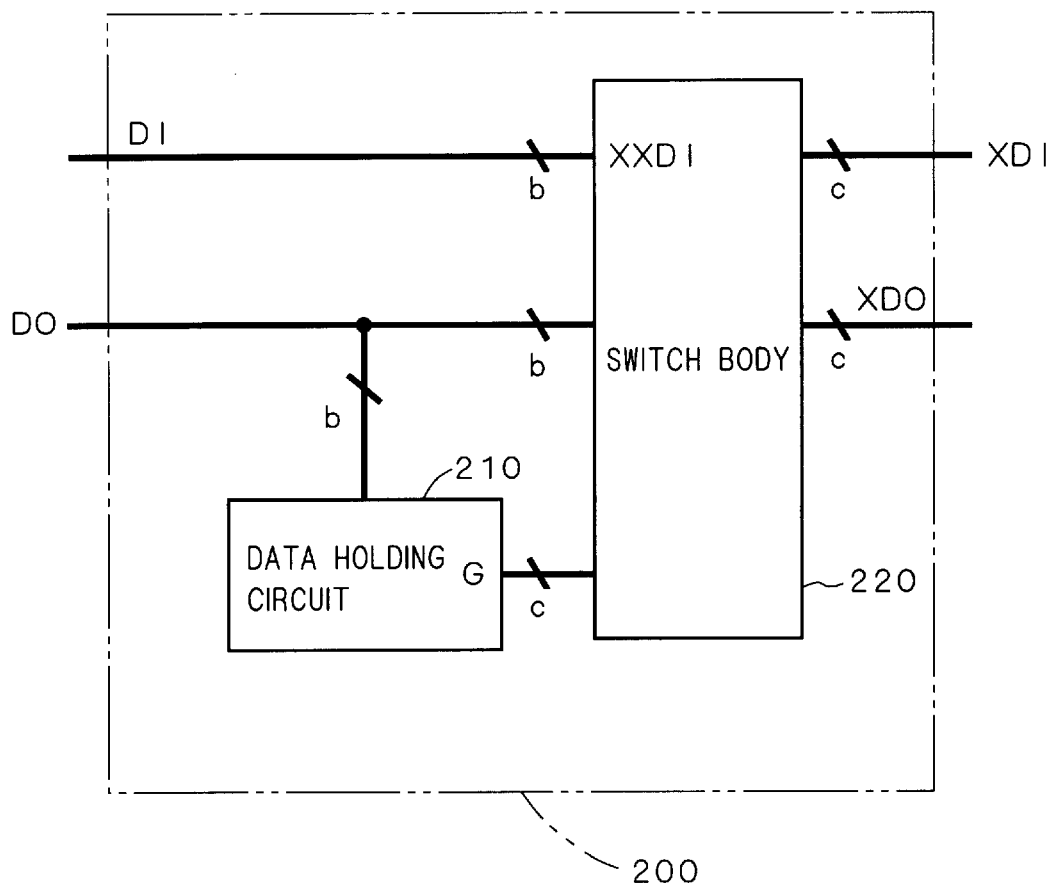
FIG. 2 is a circuit diagram of a switch according to a first preferred embodiment of the present invention.

FIG. 2 is a circuit diagram of the switch 200. The switch 200 includes a data holding circuit 210 and a switch body 220. The data holding circuit 210 is connected to the data bus BO1 and outputs c-bit data G. The switch body 220 in this first preferred embodiment is connected to the data buses BI2, BI1, BO1, and BO2.

In the first preferred embodiment, like the conventional case, the switch 200 serves as a redundancy circuit for relieving the RAM 100 of its failures.

Figure 3:
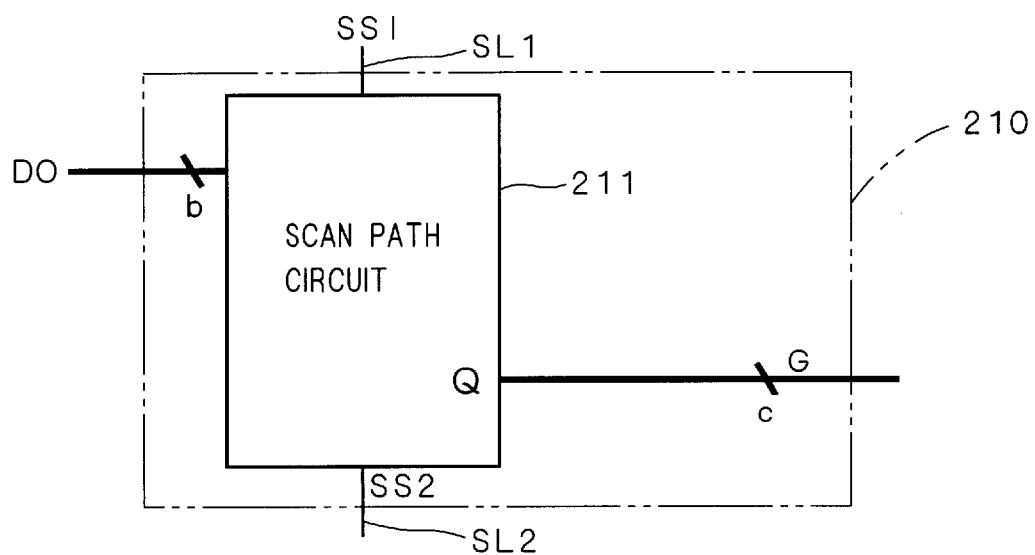
FIG. 3 is a circuit diagram of a data holding circuit according to the first preferred embodiment of the present invention.

FIG. 3 is a circuit diagram of the data holding circuit 210. The data holding circuit 210 includes a scan path circuit (test circuit) 211. The scan path circuit 211 is connected to the data bus BO1 and lines SL1 (one of the first signal transmission paths) and SL2. It receives the data DO in parallel form from the data bus BO1 to hold it as data Q, receives serial data SS1 in serial form from the line SL1 to hold it as data Q, and outputs data Q therein as serial data SS2 to the line SL2 and as data G in parallel form.

Figure 4:
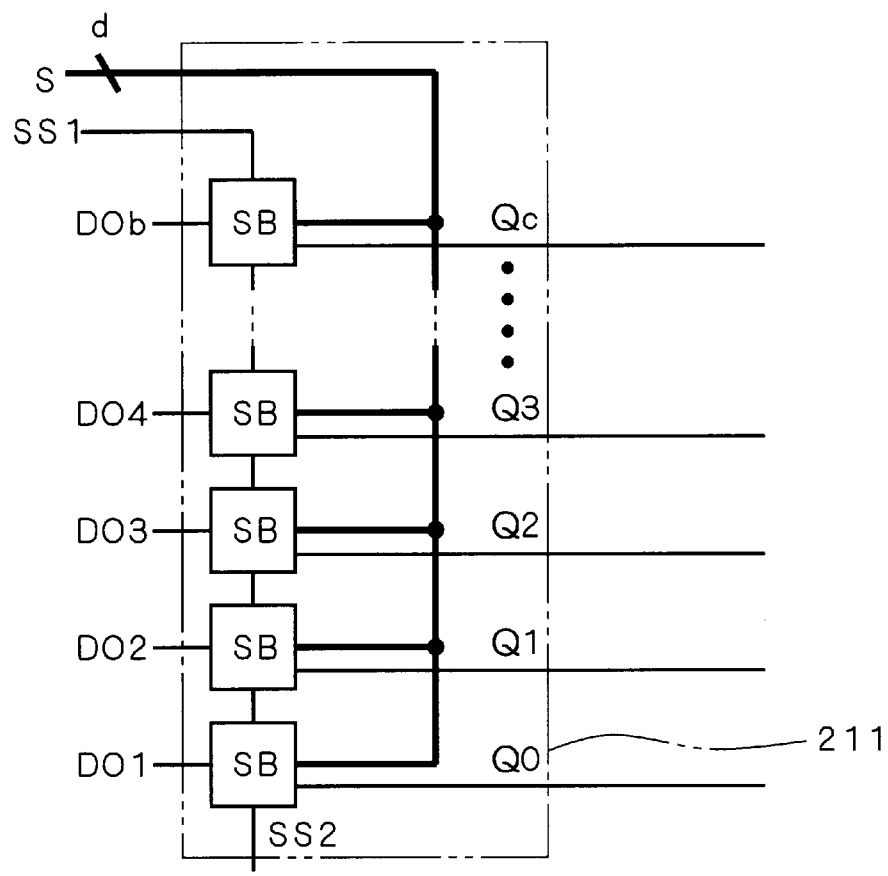
FIG. 4 is a circuit diagram of a scan path circuit according to the first preferred embodiment of the present invention.

FIG. 4 is a circuit diagram of the scan path circuit 211. The scan path circuit 211 herein includes b scan path blocks SB connected in series. The m-th (herein m=1, 2, ..., b) scan path block SB receives and holds 1-bit data DOm from the m-th line of the data bus BO1 and 1-bit data SOm+1 from the (m+1)th (ante-stage) scan path block SB, and outputs 1-bit data Qm−1 and SOm.

Figure 5:
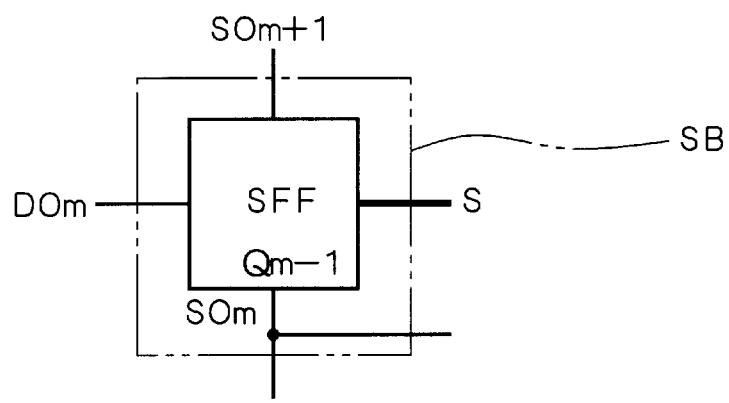
FIG. 5 is a circuit diagram of a scan path block according to the first preferred embodiment of the present invention.

FIG. 5 is a circuit diagram of the m-th scan path block SB. The scan path block SB herein includes one scan path flip flop circuit SFF. The m-th scan path flip flop circuit SFF receives the 1-bit data DOm from the m-th line of the data bus BO1, the 1-bit data SOm+1, and a scan path control signal S, and outputs the 1-bit data Qm−1 and SOm. Here the 1-bit data Qm−1 and SOm are identical.

Figure 6:
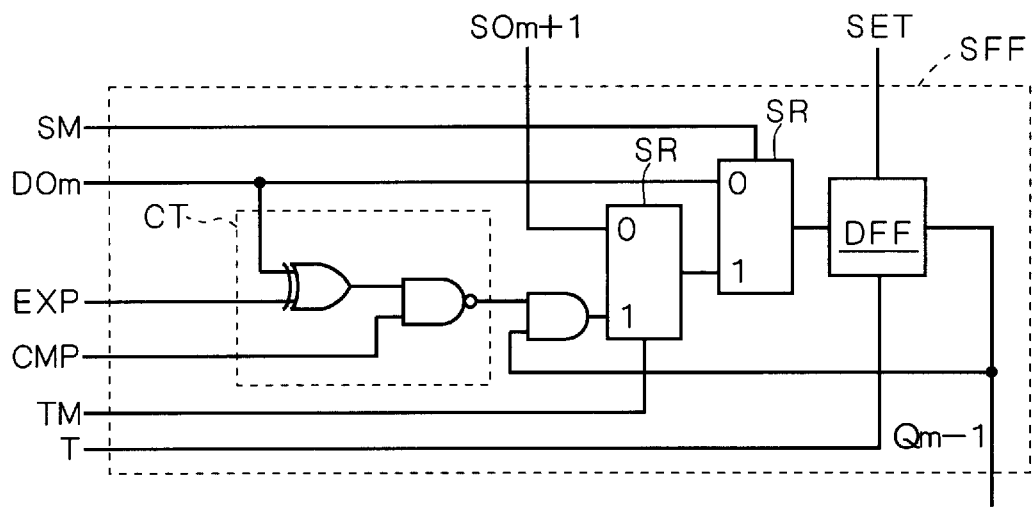
FIG. 6 is a circuit diagram of a scan path flip flop circuit according to the first preferred embodiment of the present invention.

FIG. 6 is a circuit diagram of the scan path flip flop circuit SFF. The scan path control signal S herein is constituted by signals SM, TM, CMP, EXP, and T. The scan path flip flop circuit SFF also receives the switch control signal SET.

With the switch control signal SET being "1", a D-type flip flop circuit DFF forcefully rewrites the 1-bit data Qm−1 therein with "1". With the signal SET being "0", the signals SM, TM, CMP, and EXP are set in such a combination as shown in TABLE 1. In TABLE 1, an expected value exp is either "1" or "0".

TABLE 1

| Mode | SM | TM | CMP | EXP |
|---|---|---|---|---|
| Normal | 0 | 0 | 0 | 0 |
| Shift | 1 | 0 | 0 | 0 |
| Hold | 1 | 1 | 0 | 0 |
| Compare | 1 | 1 | 1 | exp |

The expected value applied to the scan path flip flop circuits SFF may be or may not be the same. For example, the expected value for even-numbered scan path flip flop circuits SFF and that for odd-numbered scan path flip flop circuits SFF may be different.

Figure 7:
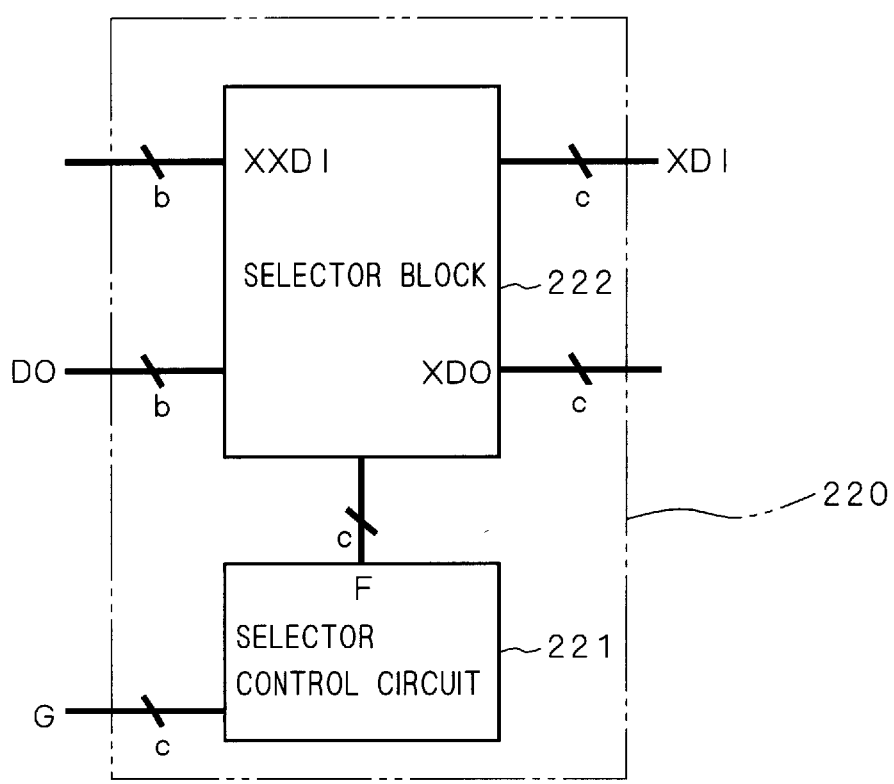
FIG. 7 is a circuit diagram of a switch body according to the first preferred embodiment of the present invention.

FIG. 7 is a circuit diagram of the switch body 220. The switch body 220 includes a selector control circuit 221 and a selector block 222. The selector control circuit 221 receives the data G and outputs a selector control signal F. The selector block 222 herein is connected to the data buses BI2, BI1, BO1, BO2 and receives the selector control signal F.

Figure 8:
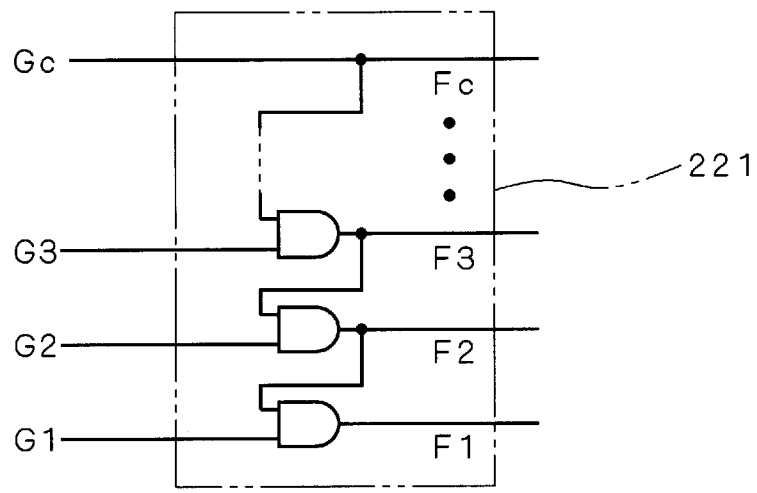
FIG. 8 is a circuit diagram of a selector control circuit according to the first preferred embodiment of the present invention.

FIG. 8 is a circuit diagram of the selector control circuit 221. The selector control circuit 221 includes (c−1) AND circuits. The m-th (herein m=1, 2, ..., c−1) AND circuit receives 1-bit data Gm and a selector control signal Fm+1, and outputs a selector control signal Fm.

Figure 9:
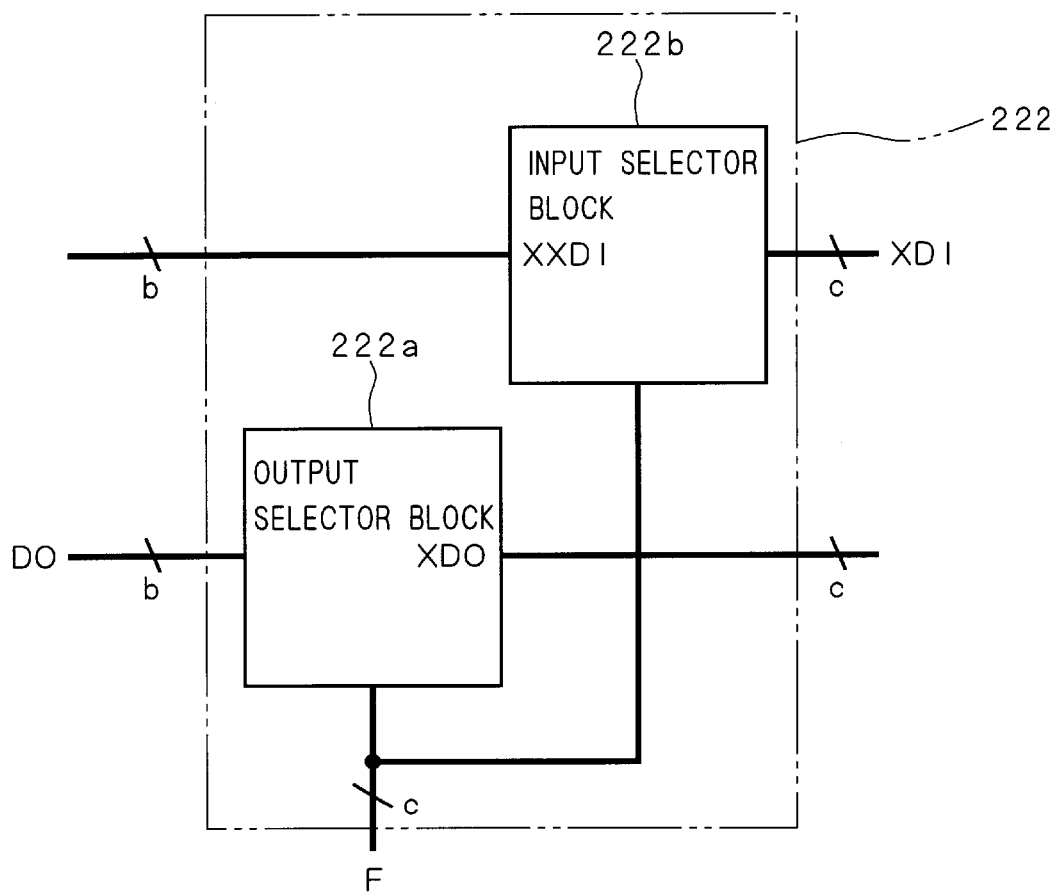
FIG. 9 is a circuit diagram of a selector block according to the first preferred embodiment of the present invention.

FIG. 9 is a circuit diagram of the selector block 222. The selector block 222 includes an output selector block 222a and an input selector block 222b. The output selector block 222a is connected to the data buses BO1 and BO2 and receives the selector signal F. The input selector block 222b is connected to the data buses BI2 and BI1 and receives the selector signal F.

Figure 10:
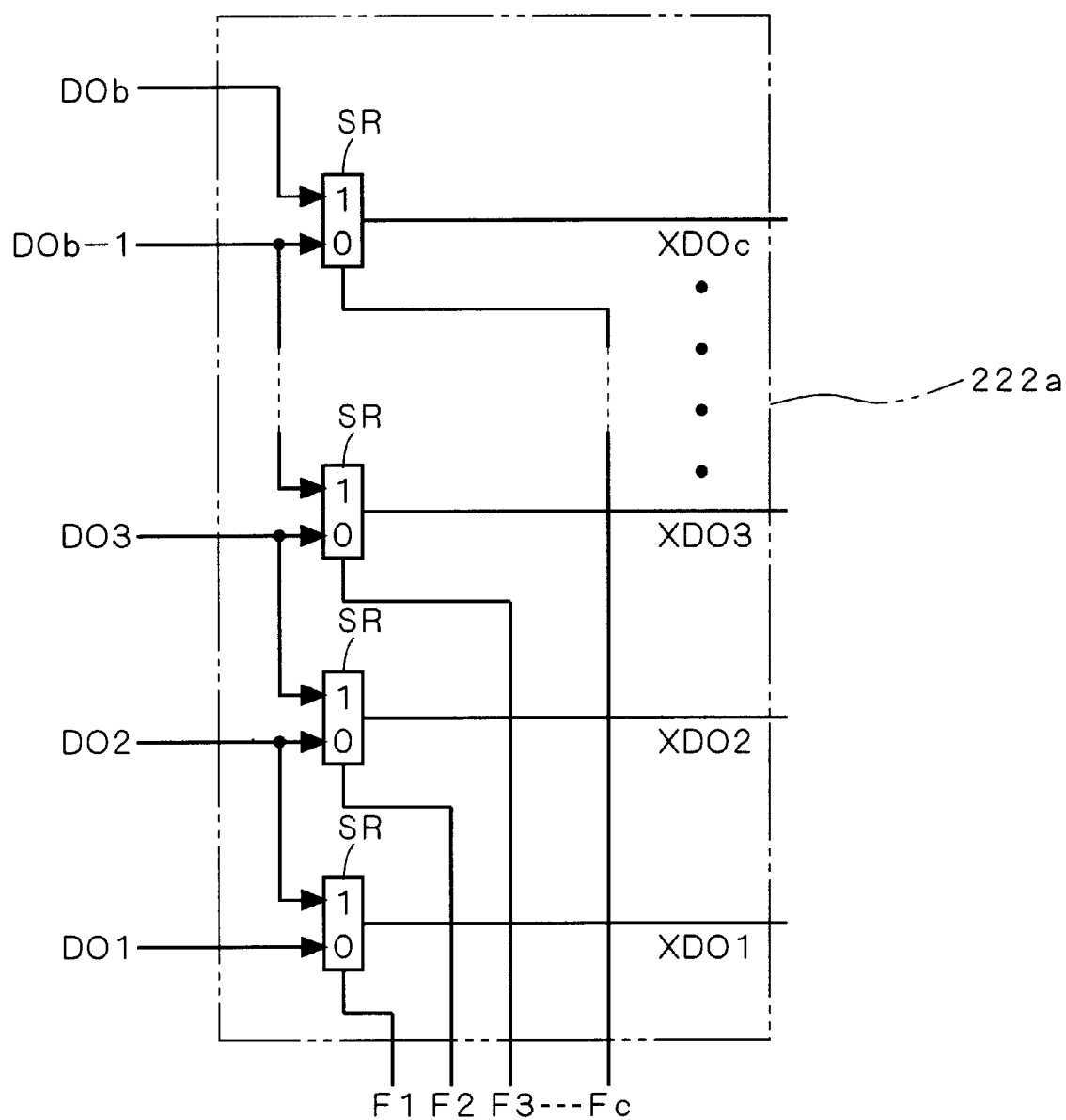
FIG. 10 is a circuit diagram of an output selector block according to the first preferred embodiment of the present invention.

FIG. 10 is a circuit diagram of the output selector block 222a. The output selector block 222a includes c selectors SR. The m-th (herein m=1, 2, ..., c) selector SR receives the 1-bit data DOm, DOm+1 and the selector control signal Fm, and outputs 1-bit data XDOm.

The values "1" and "0" in each selector SR of FIG. 10 correspond to signals to be selected. For example, the first selector SR selects and outputs 1-bit data DO1 when a selector control signal F1 is "0" and 1-bit data DO2 when the selector control signal F1 is "1". The same goes for the other drawings.

Figure 11:
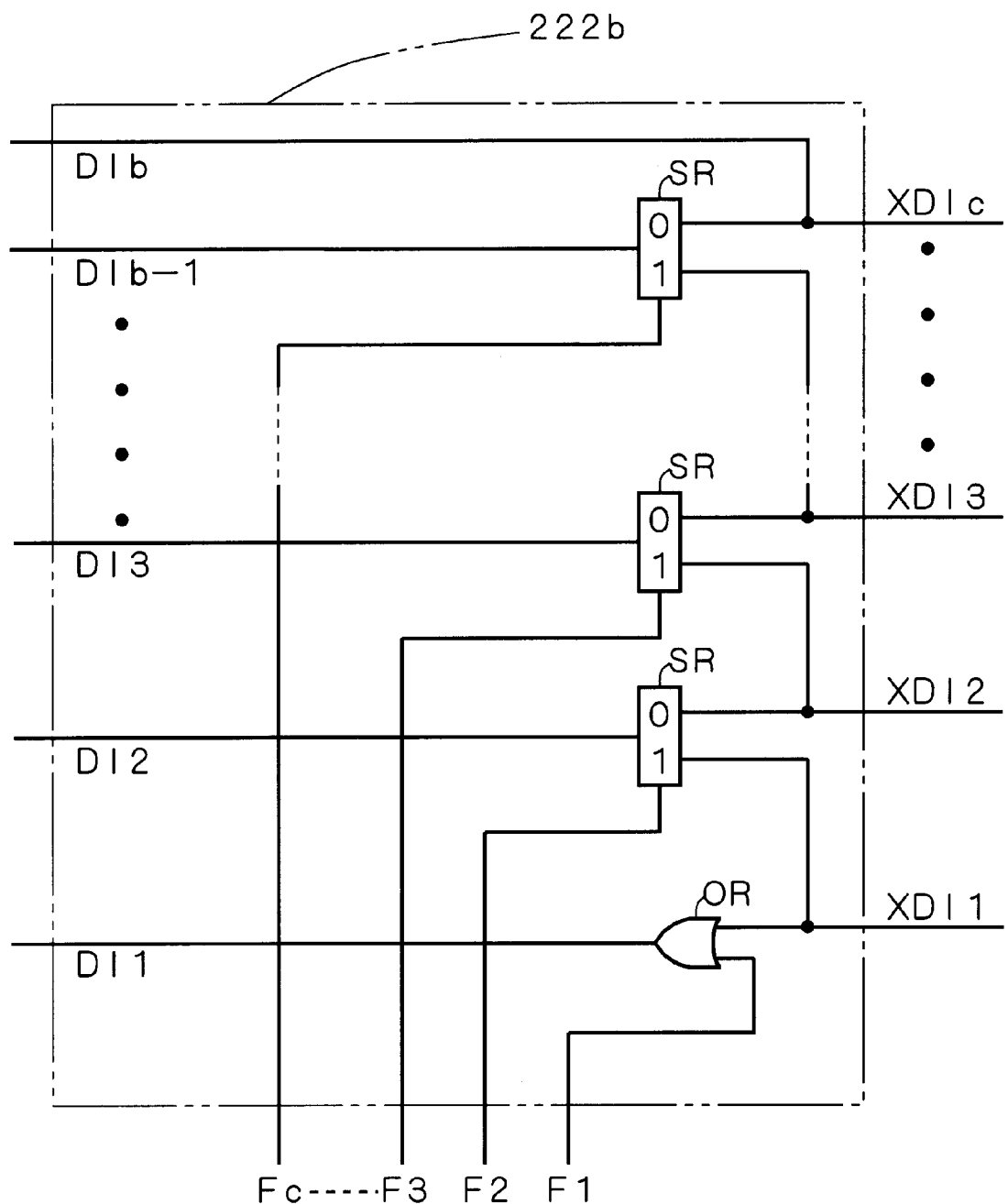
FIG. 11 is a circuit diagram of an input selector block according to the first preferred embodiment of the present invention.

FIG. 11 is a circuit diagram of the input selector block 222b. The input selector block 222b includes (c−1) selectors SR and one OR circuit OR. The m-th (herein m=1, 2, ..., c) selector SR receives 1-bit data XDIm, XDIm−1 and the selector control signal Fm, and outputs 1-bit data DIm. The first selector SR is the OR circuit OR, which receives 1-bit data XDI1 and the selector control signal F1 and outputs 1-bit data DI1. Further, 1-bit data DIb is always equivalent to 1-bit data XDIc. Alternatively, the OR circuit OR may be omitted by setting the 1-bit data XDI1 to be always equivalent to the 1-bit data DI1.

Next, the operation is described. As previously described, the D-type flip flop circuit DFF forcefully rewrites the 1-bit data Qm−1 therein with "1" when the switch control signal SET (FIG. 6) is "1", whereby all bits of the data G in FIG. 7 are set to "1". With all the bits of the data G being "1", the selector control circuit 221 sets all bits of the selector control signal F to "1". With all the bits of the selector control signal F being "1", the output selector block 222a in FIG. 10 outputs the 1-bit data DOm+1 as XDOm and the input selector block 222b in FIG. 11 outputs the 1-bit data XDIm as DIm+1.

In this fashion, if the switch control signal SET applied to the scan path circuit 211 satisfies a condition that the value is "1", data is outputted to a predetermined line of the data buses BO2 and BI2 (FIG. 1). This eliminates the need for determining a line to which data is transmitted according to the data, thus considerably facilitating the test of the logic circuit 300 when compared to that in the conventional case. For example, a predetermined expected value is stored into the RAM 100 at every address and applied to the logic circuit 300 through the switch 200. This enables a test of whether the logic circuit 300 operates as intended or not. In such a test, if the switch control signal SET is set to "1", data is transmitted to a predetermined line, and thus, the test of the logic circuit 300 becomes fairly easy.

By the way, when the switch control signal SET is "0", data is outputted to either of the data buses BO2, BI2 which corresponds to data values from the data buses BO1, BI1 and the line SL1. We will now describe the operation when the switch control signal SET is "0".

With the switch control signal SET being "0", the semiconductor device is, as shown in TABLE 1, placed in any one of normal, shift, hold, and compare modes.

If the signal SM is set to "0", the device goes into the normal mode wherein the scan path flip flop circuit SFF in FIG. 6 receives the 1-bit data DOm.

If the signals SM and TM are set to "1", "0", respectively, the device goes into the shift mode wherein the scan path performs a serial shift operation. That is, the serial data SS1 (cf. FIG. 4) different from the data DO is transmitted through the scan path blocks SB in descending order of block, starting at b, and outputted as the serial data SS2 to an external terminal (not shown).

If the signals SM, TM, and CMP are set to "1", "1", "0", respectively, the device goes into the hold mode wherein the 1-bit data Qm−1 outputted from the D-type flip flop circuit DFF is applied to the same D-type flip flop circuit DFF as input data. The data held in the D-type flip flop circuit DFF thus remains unchanged during the hold mode.

If the signals SM, TM, and CMP are all set to "1", the device goes into the compare mode wherein the value of the D-type flip flop circuit DFF is rewritten with a comparison result between the data DO and the expected value exp (i.e., inverted exclusive OR between the data DO and the expected value exp) which is obtained by a comparator CT in the scan path flip flop circuit SFF. The comparison result is "1" when the data DO and the expected value exp agree and "0" when they disagree.

Now, we will give a concrete example of how to use the scan path of the first preferred embodiment. First, all bits at every address in the RAM 100 are set to "1". In this case, all bits of the data DO outputted from the RAM 100 should always be "1" unless a failure occurs in the RAM 100. However, for the convenience of description, assume herein that among all the bits in the RAM 100, only the third bit of data stored at address 8 holds "0" due to a failure in the RAM 100 and the remaining bits hold "1" as intended.

Then, the device is placed in the shift mode so that the D-type flip flop circuits DFF in all the scan path flip flop circuits SFF hold "1".

After the expect value exp to be applied to all the scan path flip flop circuits SFF is set to "1", the device is placed in the compare mode.

In the compare mode, all the data DO in the RAM 100 are read out in ascending order of address starting at 0. Each bit of the data DO is transmitted to each of the scan path flip flop circuits SFF. Since all bits of the data DO at addresses from 0 through 7 are "1", each of the scan path flip flop circuits SFF still holds "1". However, with the data DO at address 8 whose third bit is "0", the value of the third D-type flip flop circuit DFF changes to "0" for example at the next rising edge of the clock T.

After all the data DO in the RAM 100 are read out from all the addresses, the device is placed in the shift mode wherein the data held in the D-type flip flop circuits DFF are outputted as the serial data SS2. In the above example, the serial data SS2 includes "0". This "0" is the comparison result, which indicates that the RAM 100 stores data that is different from the expect value and thus there is a failure in the RAM 100.

Since the third D-type flip flop circuit DFF holds "0", the selector control signals F1 and F2 in the selector signal F are set to "0". Therefore, the output selector block 222a outputs the 1-bita data DO1 as XDO1, DO2 as XDO2, and other DOm except DO3 (herein m=4, 5, . . . , b) as XDOm−1. The input selector block 222b outputs the 1-bit data XDI1 as DI1, XDI2 as DI2 and DI3, and other XDIm (herein m=3, 5, . . . , c) as DIm+1.

Next, the device is placed in hold mode so that the data in the scan path blocks SB remain unchanged. In this fashion, the RAM 100 can be used as a c-bit RAM excluding the third bit of trouble, and the switch 200 serves as a redundancy circuit for relieving the RAM 100 of its failures.

In the first preferred embodiment, the scan path circuit 211 in the data holding circuit 210 rewrites the data therein with a predetermined value if the switch control signal SET satisfies a predetermined condition. This achieves the operation of the switch 200 according to the present invention.

Second Preferred Embodiment

FIG. 12 is another circuit diagram of the data holding circuit 210. In a second preferred embodiment, the data holding circuit 210 further includes a register (redundancy control register) 212. The register 212 receives and holds the data Q and outputs it as the data G.

FIG. 13 is a circuit diagram of the register 212. The register 212 in FIG. 13 includes c D-type flip flop circuits DFF. The m-th (herein m=1, 2, . . . , c) D-type flip flop circuit DFF receives and holds the 1-bit data Qm and outputs it as Gm. If the switch control signal SET is "1", however, the circuit DFF rewrites the 1-bit data Gm therein with "1".

In the second preferred embodiment, the switch control signal SET is applied not to the scan path circuit 211 but to the register 212. The other components are identical to those in the first preferred embodiment.

Next, the operation is described. With the switch control signal SET being "1", as previously described, the D-type flip flop circuit DFF forcefully rewrites the 1-bit data Gm therein with "1", whereby all bits of the data G and of the selector control signal F are set to "1". The output block selector 222a in FIG. 10 thus outputs the 1-bit data DOm+1 as XDOm and the input block selector 222b in FIG. 11 outputs the 1-bit data XDIm as DIm+1, as in the first preferred embodiment.

The other operations are as described in the first preferred embodiment.

Figure 14:
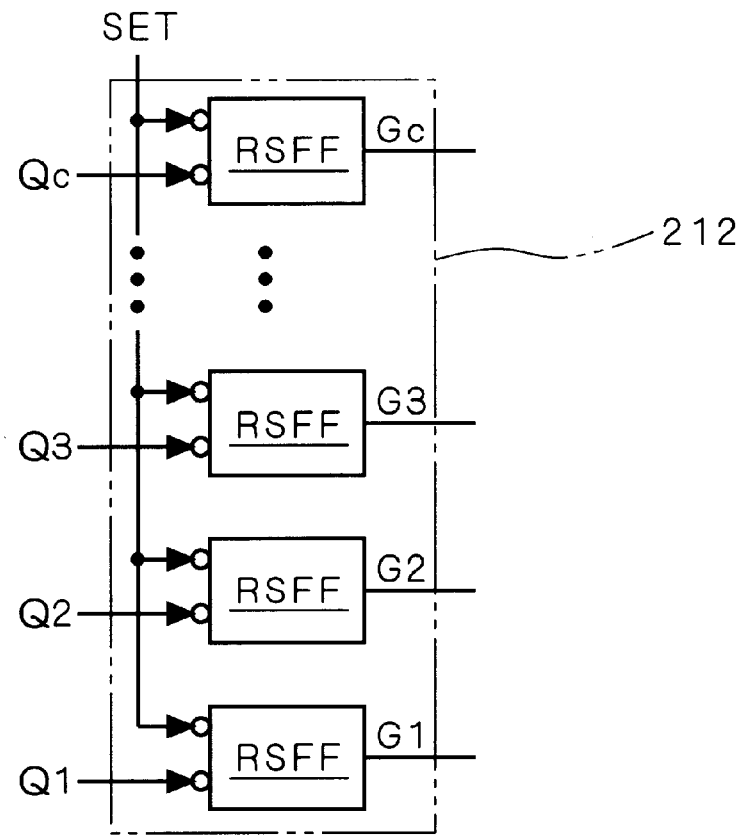
Figure 15:
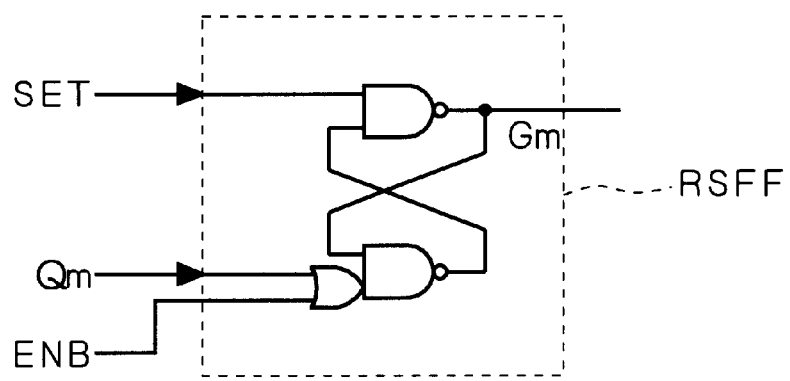
FIG. 15 is a circuit diagram of an RS flip flop circuit according to the second preferred embodiment of the present invention.

The register 212 may alternatively be composed of RS flip flops RSFF as shown in FIG. 14. FIG. 15 shows one of the RS flip flops RSFF. The RS flip flop RSFF can forcefully rewrites the 1-bit data Qm with "1" when the switch control signal SET is "0". Further, if an enable signal ENB is set to "0" when the switch control signal SET is "1", the RS flip flop RS can receive and hold the 1-bit data Qm from the scan path circuit 211. This register thus performs equivalent operation to that in FIG. 13.

The register 212 may still alternatively be composed of master slave flip flops or half latches.

In this fashion, if the switch control signal SET applied to the register 212 satisfies a predetermined condition, data is outputted to a predetermined line of the data buses BO2 and BI2 (FIG. 1). This eliminates the need for determining a line to which data is transmitted according to the data as in the first preferred embodiment, thus considerably facilitating the test of the logic circuit 300.

In the second preferred embodiment, the register 212 in the data holding circuit 210 further rewrites the data therein with a predetermined value if the switch control signal SET satisfies a predetermined condition. This achieves the operation of the switch 200 according to the present invention.

Third Preferred Embodiment

Figure 16:
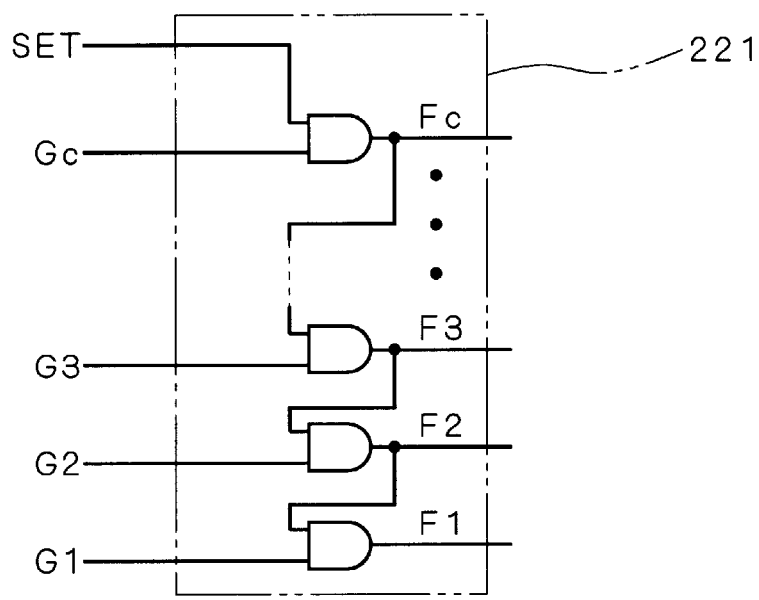
FIGS. 16 through 20 are circuit diagrams of selector control circuits according to a third preferred embodiment of the present invention.

FIG. 16 is another circuit diagram of the selector control circuit 221. The selector control circuit 221 in FIG. 16 includes c AND circuits. The m-th (herein m=1, 2, . . . , c−1) AND circuit receives the 1-bit data Gm and the selector control signal Fm+1, and outputs the selector control signal Fm. The c-th AND circuit receives 1-bit data Gc and the switch control signal SET, and outputs a selector control signal Fc.

Figure 17:
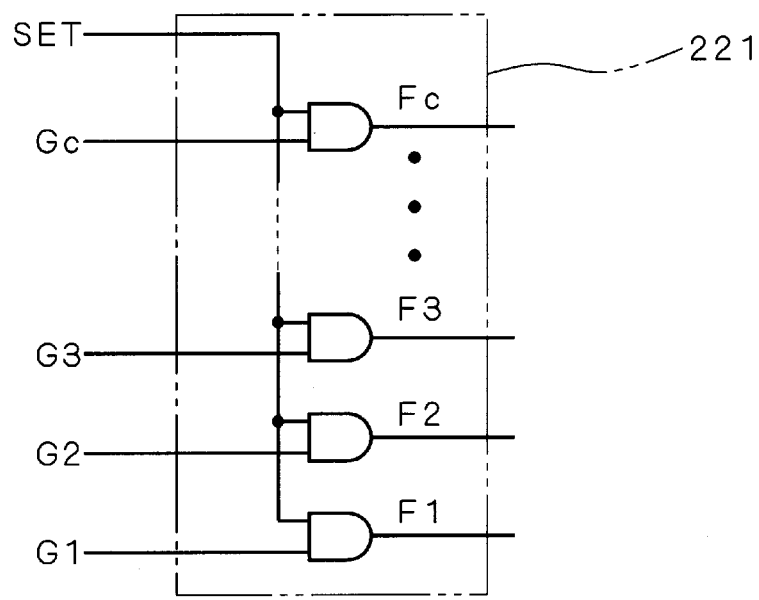

The selector control circuit 221 may alternatively be configured as shown in FIG. 17. The selector control circuit 221 in FIG. 17 includes c AND circuits. The m-th (herein m=1, 2, . . . , c) AND circuit receives the 1-bit data Gm and the switch control signal SET, and outputs the selector control signal Fm.

In the third preferred embodiment, the switch control signal SET is applied not to the data holding circuit 210 but to the selector control circuit 221. The other components are identical to those in the first and second preferred embodiment.

Now, the operation in FIGS. 16 and 17 is described. As previously described, the AND circuit forcefully rewrites the selector control signal Fm with "0" when the switch control signal SET is "0", whereby all bits of the selector control signal F are set to "0".

With all the bits of the selector control signal F being "0", the output selector block 222a in FIG. 10 outputs the 1-bit data DOm as XDOm and the input selector block 222b in FIG. 11 outputs the 1-bit data XDIm as DIm.

The switch control signal SET may further be applied to the data holding circuit 210 as in the first and second preferred embodiments. Here the switch control signal applied to the data holding circuit 210 and the switch control signal applied to the selector control circuit 221 may be independent of each other. The use of the two different switch control signals enables determination of whether or not there is a failure in the selectors SR in the selector block 222. For example, all bits of the data G are set to "1" by applying the switch control signal SET of "1" to the data holding circuit 210. In this state, the switch control signal applied to the selector control circuit 221 is switched to "0" or "1" to see changes in the data XDO, DI. By so doing, whether or not there is a failure in the selectors SR can be checked.

Figure 18:
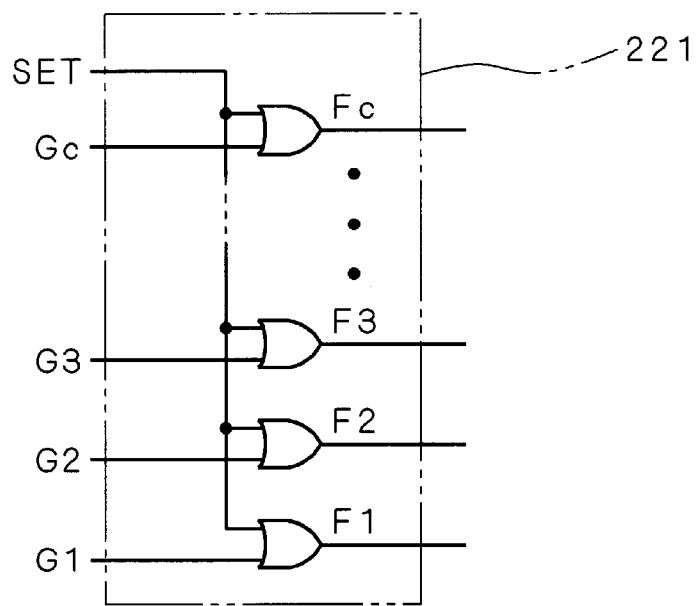

The selector control circuit 221 may alternatively be configured as shown in FIG. 18. The selector control circuit 221 in FIG. 18 includes c OR circuits. The m-th (herein m=1, 2, . . . , c) OR circuit receives the 1-bit data Gm and the switch control signal SET, and outputs the selector control signal Fm.

Next, the operation of the selector control circuit in FIG. 18 is described. As previously described, the OR circuit forcefully rewrites the selector control signal Fm with "1" when the switch control signal SET is "1", whereby all bits of the selector control signal F are set to "1". Therefore, the output selector block 222a in FIG. 10 outputs the 1-bit data DOm+1 as XDOm and the input selector block 222b in FIG. 11 outputs the 1-bit data XDIm as DIm+1 as in the first preferred embodiment.

Figure 19:
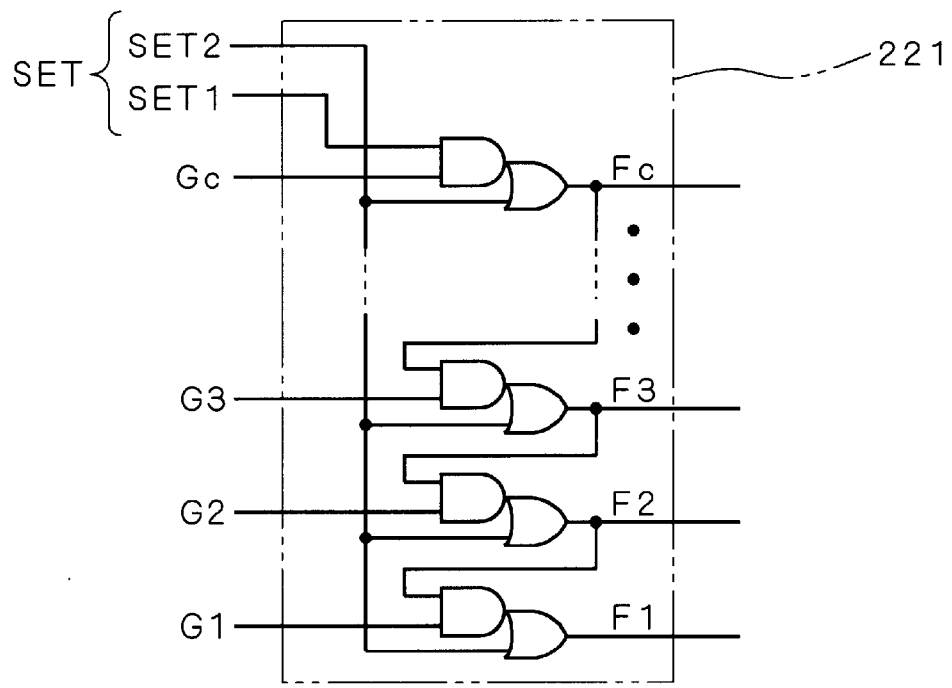
Figure 20:
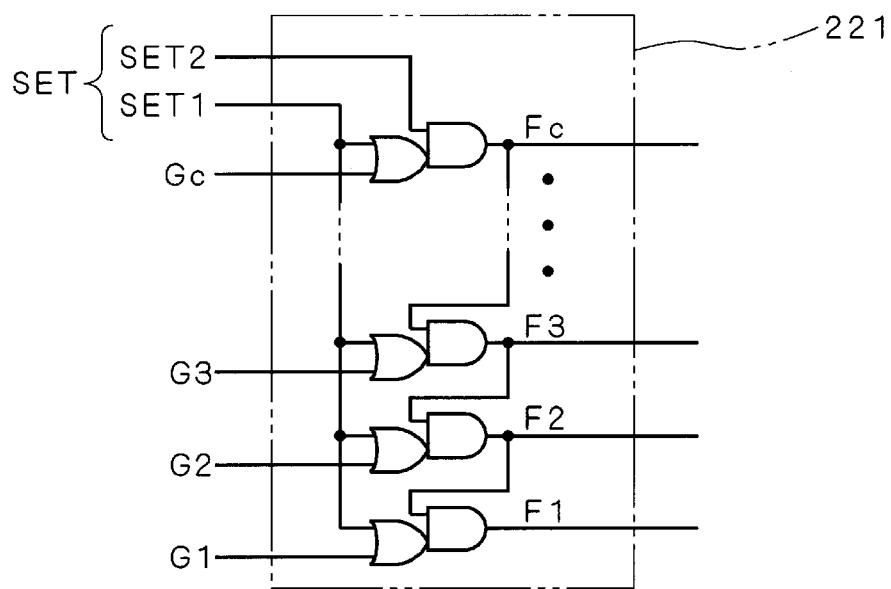

The selector control circuit 221 may still alternatively be configured as shown in FIGS. 19 and 20. In FIGS. 19 and 20, the switch control signal SET consists of switch control signals SET1 and SET2. The use of the two switch control signals enables determination of whether or not there is a failure in the selectors SR in the selector block 222.

In the cases of FIGS. 19 and 20, if the switch control signals SET1 and SET2 are set properly, all the bits of the selector control signal F can be set to either "1" or "0".

In this fashion, if the switch control signal SET applied to the selector control circuit 221 satisfies a predetermined condition, data is outputted to a predetermined line of the data buses BO2 and BI2 (FIG. 1). This eliminates the need for determining a line to which data is transmitted according to the data as in the first and second preferred embodiment, thus considerably facilitating the test of the logic circuit 300.

In the third preferred embodiment, the selector control signal F outputted from the selector control circuit 221 indicates a predetermined second signal transmission path when the switch control signal SET satisfies a predetermined condition, and a second signal transmission path corresponding to the value of the data G when the signal SET does not satisfy a predetermined condition. The selector block 222 then outputs data to the second signal transmission path indicated by the selector control signal F. This achieves the operation of the switch 200 according to the present invention.

Fourth Preferred Embodiment

Figure 21:
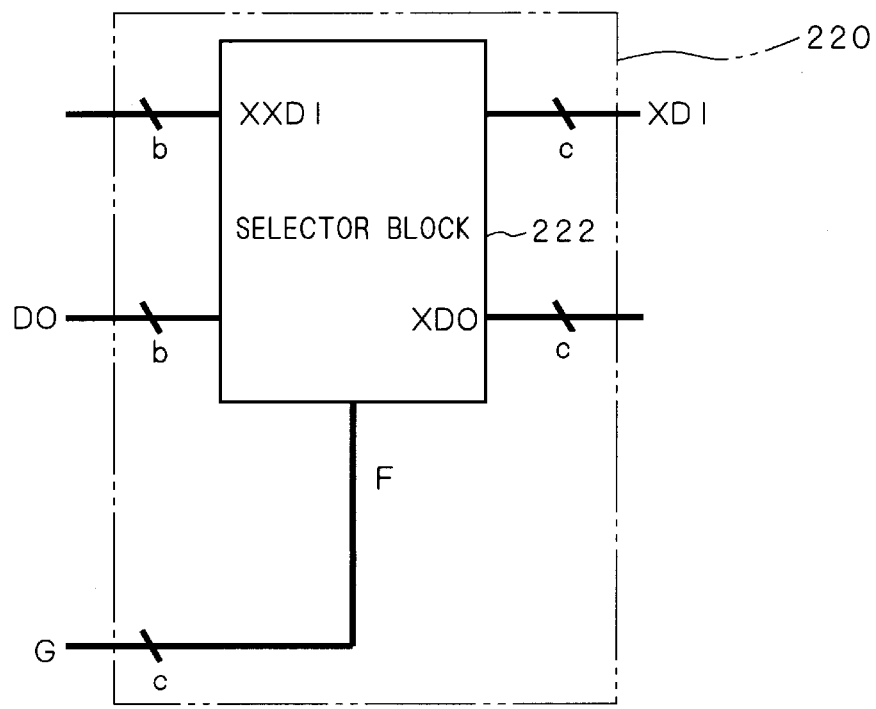
FIG. 21 is a circuit diagram of a selector block according to a fourth preferred embodiment of the present invention.

FIG. 21 is another circuit diagram of the switch body 220. The switch body 220 in FIG. 21 includes only the selector block 222, omitting the selector control circuit 221.

FIG. 22 is another circuit diagram of the output selector block 222a. The output selector block 222a in FIG. 22 includes (c×2) selectors SR. The m-th (herein m=1, 2, . . . , c) ante-stage selector SR receives the 1-bit data DOm, DOm+1 and the selector control signal Fm. The m-th post-stage selector SR receives the 1-bit data Qm, an output signal from the m-th ante-stage selector SR, and the switch control signal SET, and outputs the 1-bit data XDOm.

Figure 23:
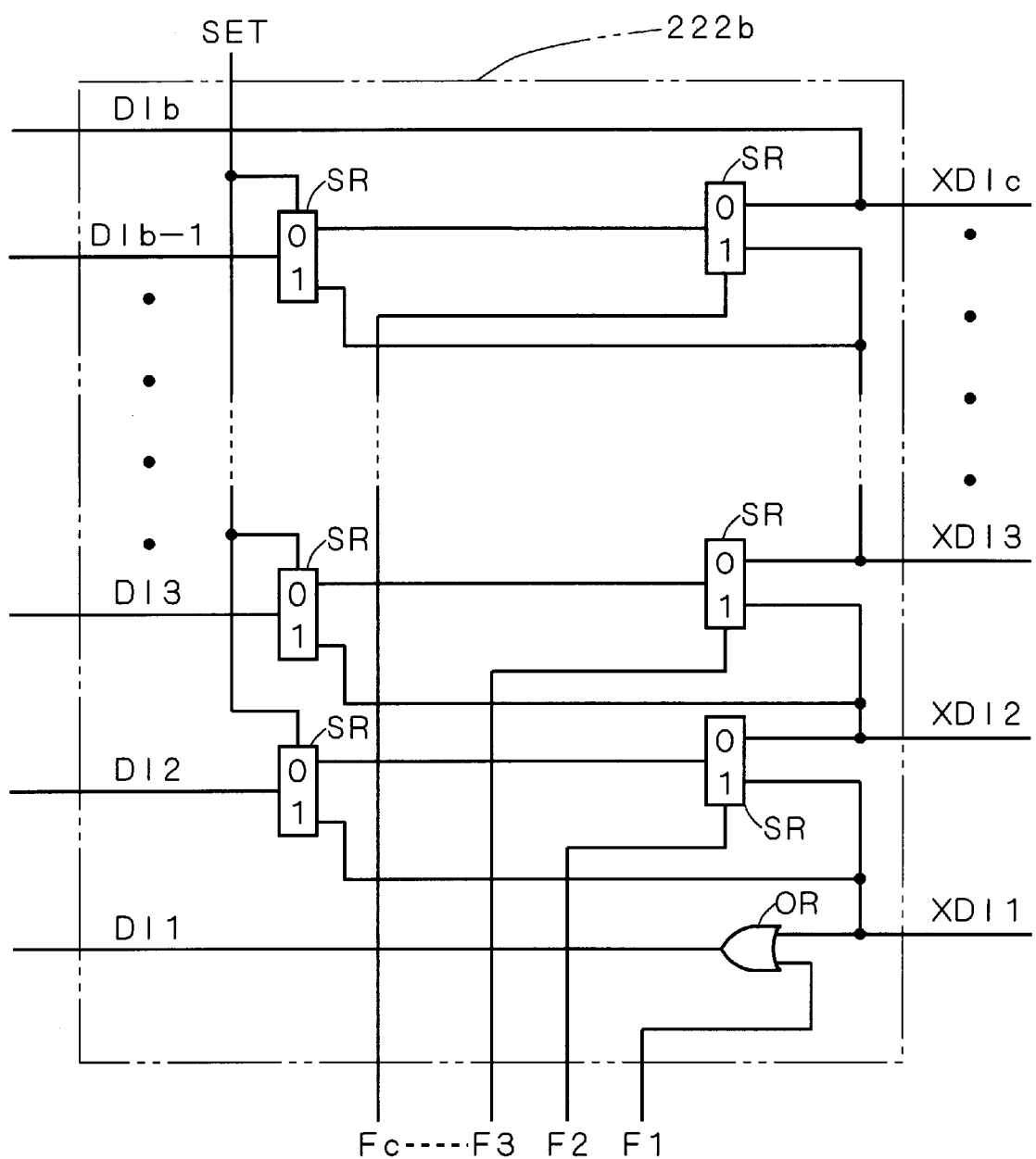
FIGS. 23 and 25 are circuit diagrams of input selector blocks according to the fourth preferred embodiment of the present invention.

FIG. 23 is another circuit diagram of the input selector block 222b. The input selector block 222b in FIG. 23 includes ((c−1)×2) selectors SR and an OR circuit OR. The m-th (herein m=2, 3, . . . , c) ante-stage selector SR receives the 1-bit data XDIm, XDIm−1 and the selector control signal Fm. The m-th post-stage selector SR receives the 1-bit data XDIm−1, an output signal from the m-th ante-stage selector SR, and the switch control signal SET, and outputs the 1-bit data DIm. The first selector corresponds to the OR circuit OR, which receives the 1-bit data XDI1 and the selector control signal F1, and outputs the 1-bit data DI1. The OR circuit OR may alternatively be omitted by setting the 1-bit data XDI1 to be always equivalent to the 1-bit data DI1.

Figure 24:
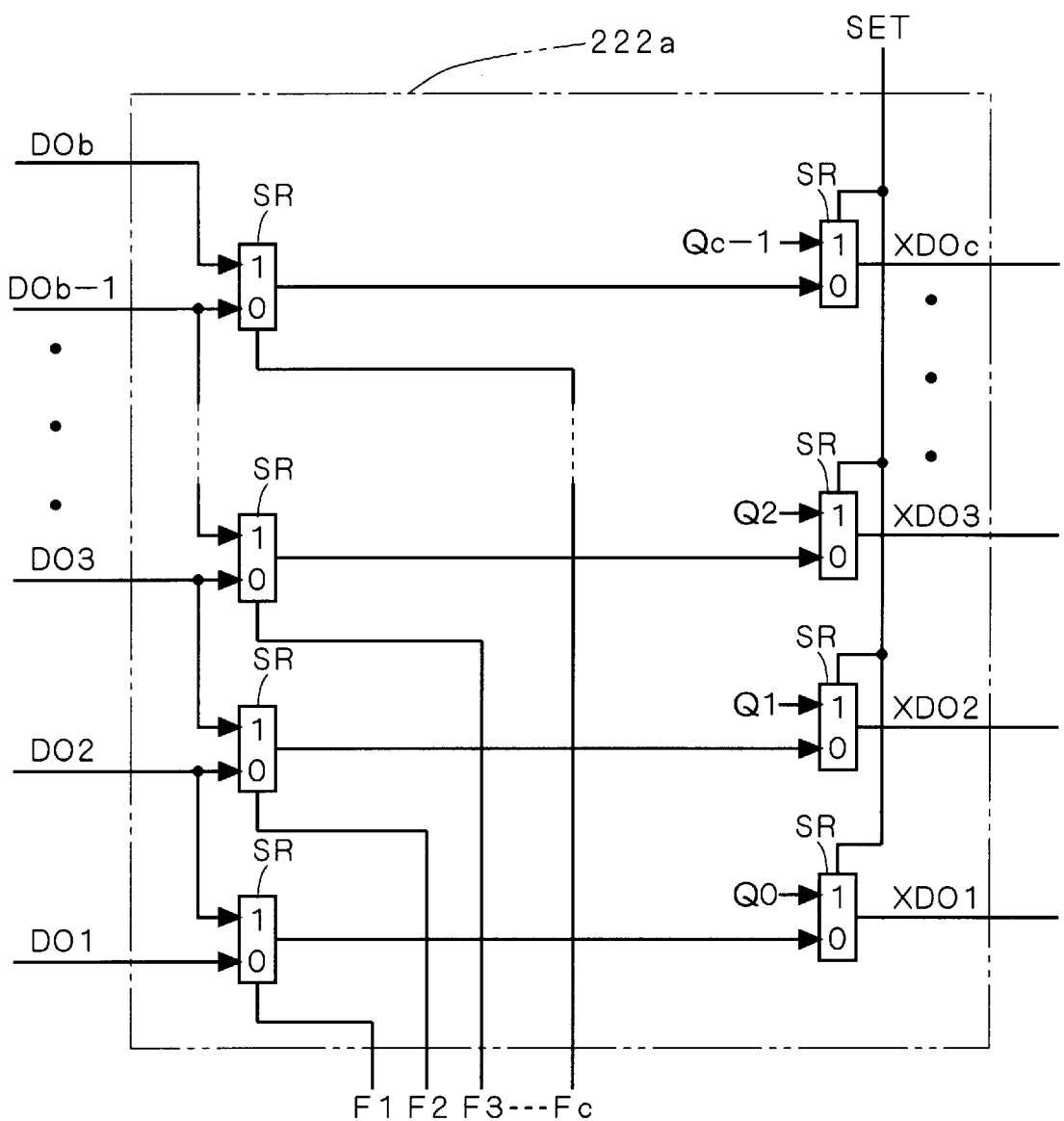

The output selector block 222a may alternatively be configured as shown in FIG. 24. In FIG. 24, the m-th post-stage selector SR receives the 1-bit data Qm−1, the output signal from the m-th ante-stage selector SR, and the switch control signal SET, and outputs the 1-bit data XDOm. The other components are identical to those in FIG. 22.

Figure 25:
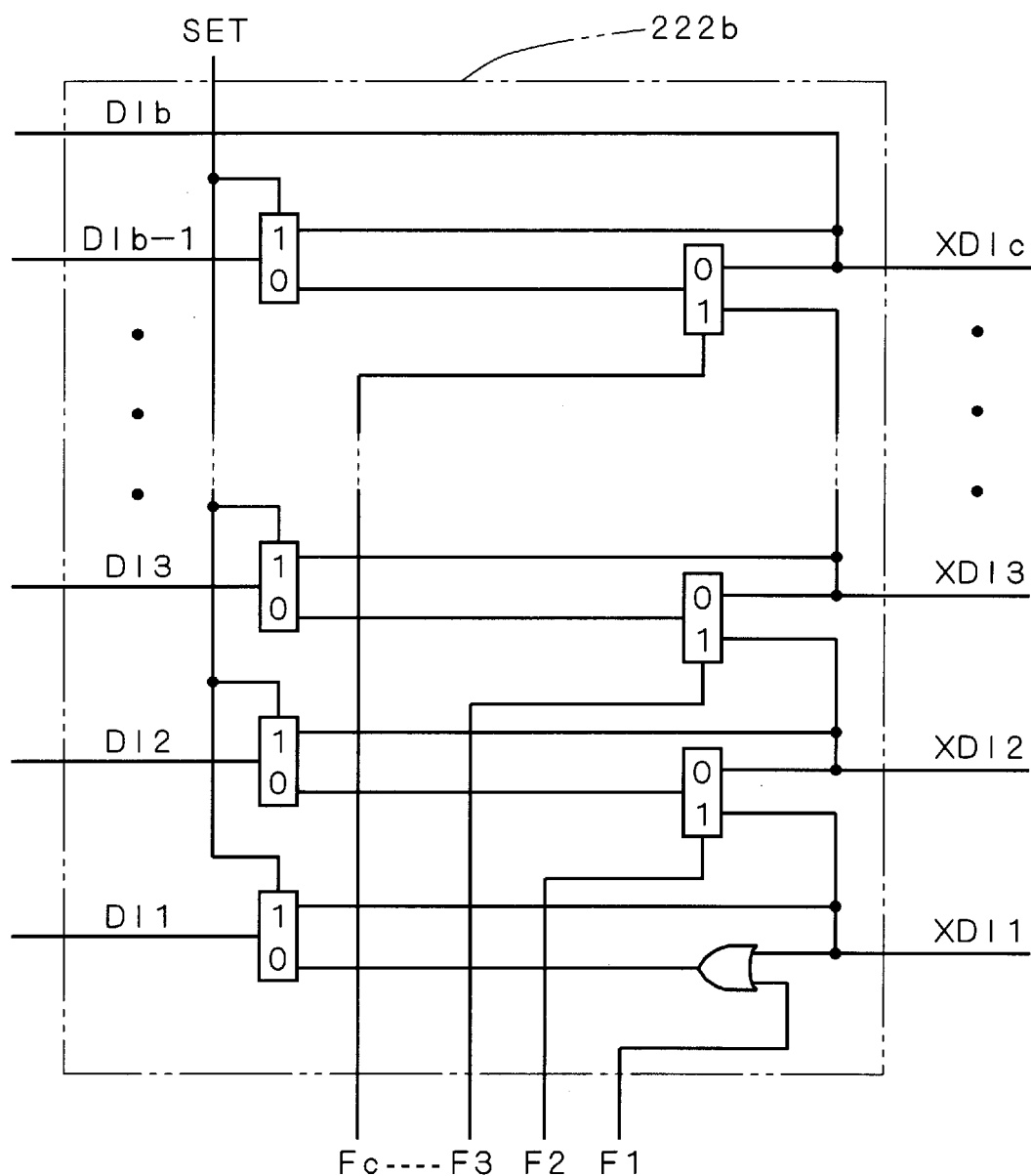

The input selector block 222b may alternatively be configured as shown in FIG. 25. In FIG. 25, the m-th post-stage selector SR receives the 1-bit data XDIm, the output signal from the m-th ante-stage selector SR, and the switch control signal SET, and outputs the 1-bit data DIm. The other components are identical to those in FIG. 23.

In the fourth preferred embodiment, the switch control signal SET is applied not to the data holding circuit 210 but to the selector block 222. The other components are identical to those in the first preferred embodiment.

Next, the operation is described. In the case of FIGS. 22 and 23, when the switch control signal SET is "1", the selector block 222 outputs the 1-bit data Qm as XDOm and the 1-bit data XDIm as DIm+1.

In this fashion, the selector block 222 including the output selector block 222a as shown in FIGS. 22 and 24 selects and outputs predetermined 1-bit data from among all the data in the RAM 100 when the switch control signal SET satisfies a predetermined condition, and it selects and outputs the 1-bit data outputted from the scan path circuit 211 when the signal SET does not satisfy a predetermined condition.

In this fashion, if the switch control signal SET applied to the selector block 222 satisfies a predetermined condition, data is outputted to a predetermined line of the data buses BO2 and BI2. This eliminates the need for determining a line to which data is transmitted according to the data as in the first and second preferred embodiment, thus considerably facilitating the test of the logic circuit 300.

In the fourth preferred embodiment, when the switch control signal SET satisfies a predetermined condition, the post-stage selector SR outputs data to a predetermined second signal transmission path. When the switch control signal SET does not satisfy the predetermined condition, on the other hand, the ante-stage selector SR outputs data to a second signal transmission path corresponding to the value of the data G. This achieves the operation of the switch 200 according to the present invention. In addition, there is no need of the selector control circuit 221.

Fifth Preferred Embodiment

The scan paths of the first through fourth preferred embodiment may be alternatively replaced by any of fifth through eleventh preferred embodiments described below. Where to apply the switch control signal SET is as described in the first through fourth preferred embodiments. For example, the switch control signal SET is applied to the D-type flip flop circuits DFF in a scan path described below.

FIG. 26 is another circuit diagram of the scan path circuit 211. The scan path circuit 211 herein includes a scan path control circuit 211a and b scan path blocks SB. The scan path circuit 211a receives and converts a scan path control signal S to output it to each of the scan path blocks SB. The other components are identical to those in FIG. 4.

Figure 27:
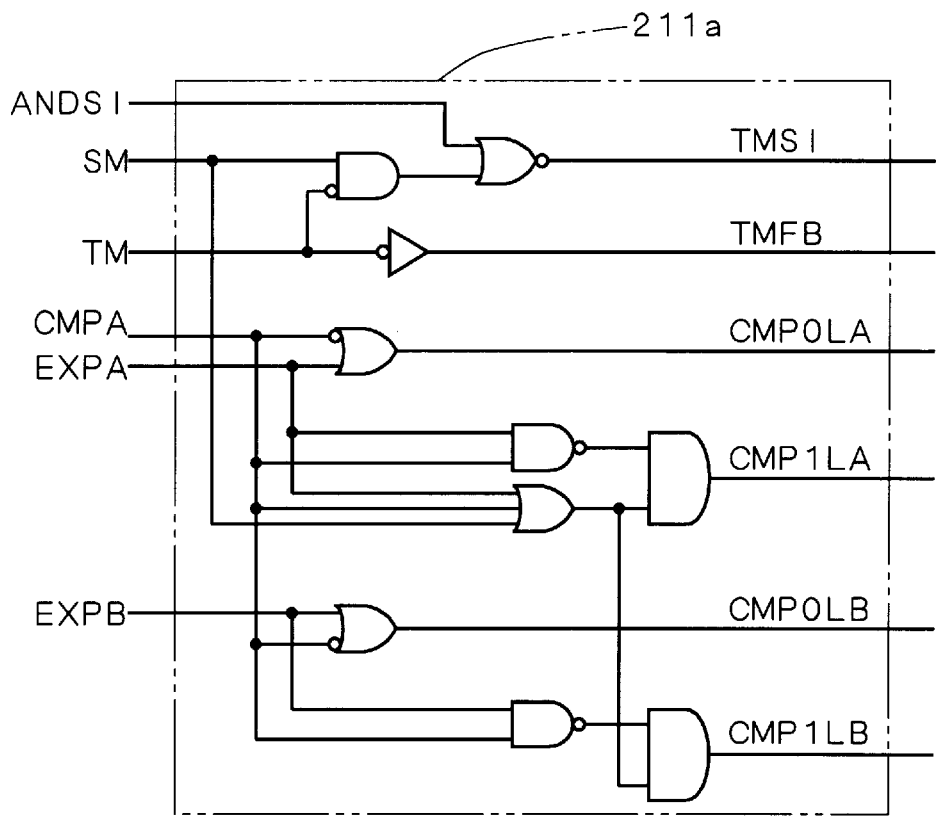
Figure 28:
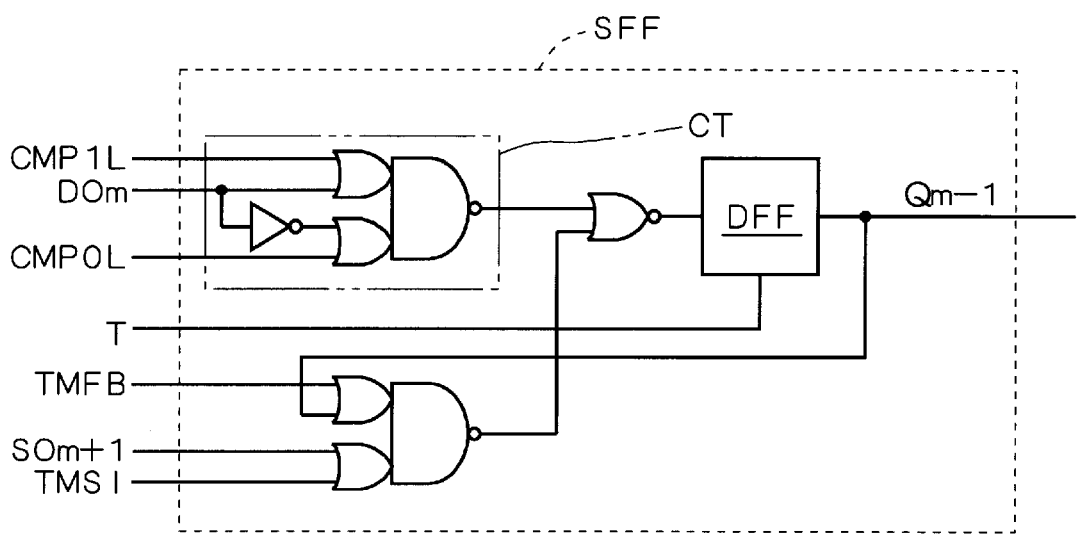
FIGS. 28 through 33 are circuit diagrams of scan path flip flop circuits according to the fifth preferred embodiment of the present invention.
Figure 29:
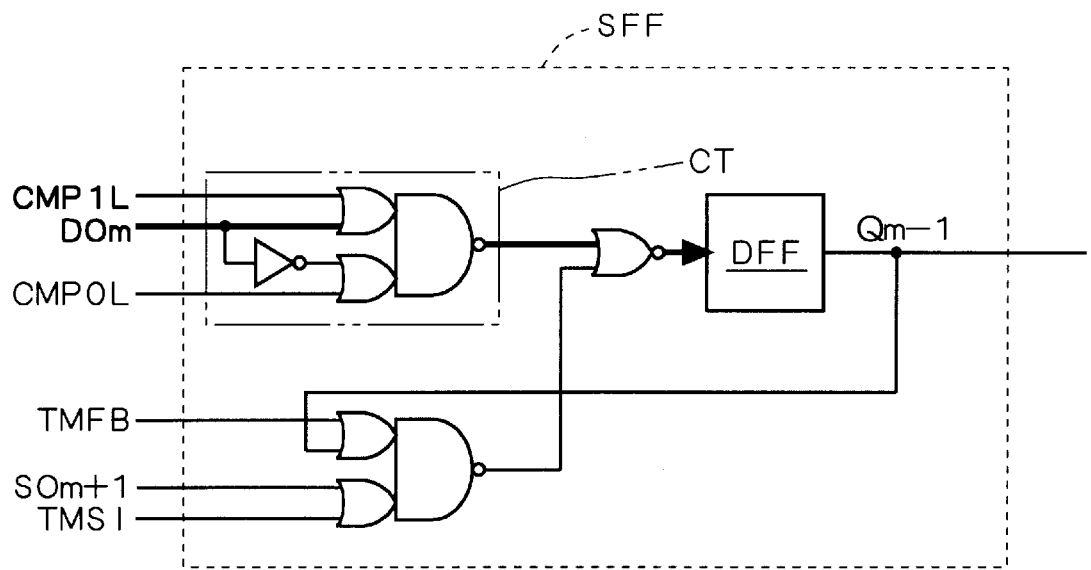
Figure 30:
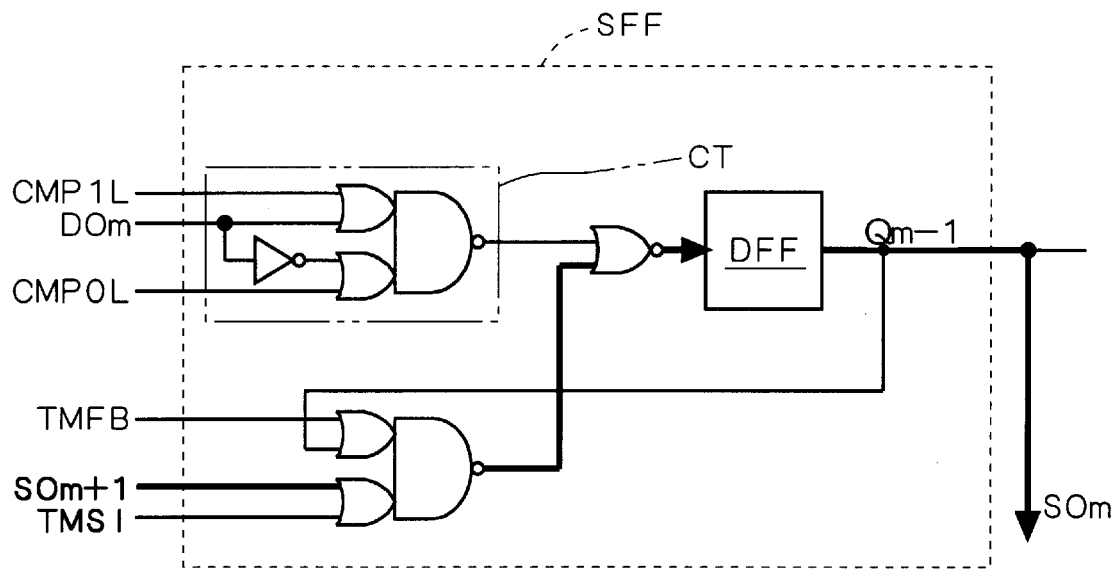
Figure 31:
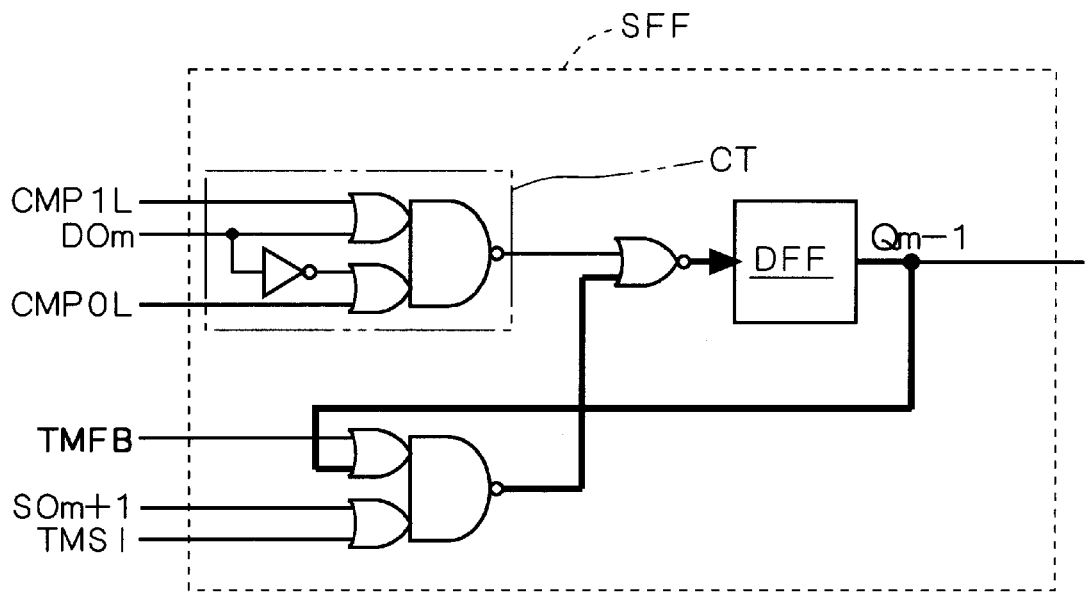
Figure 32:
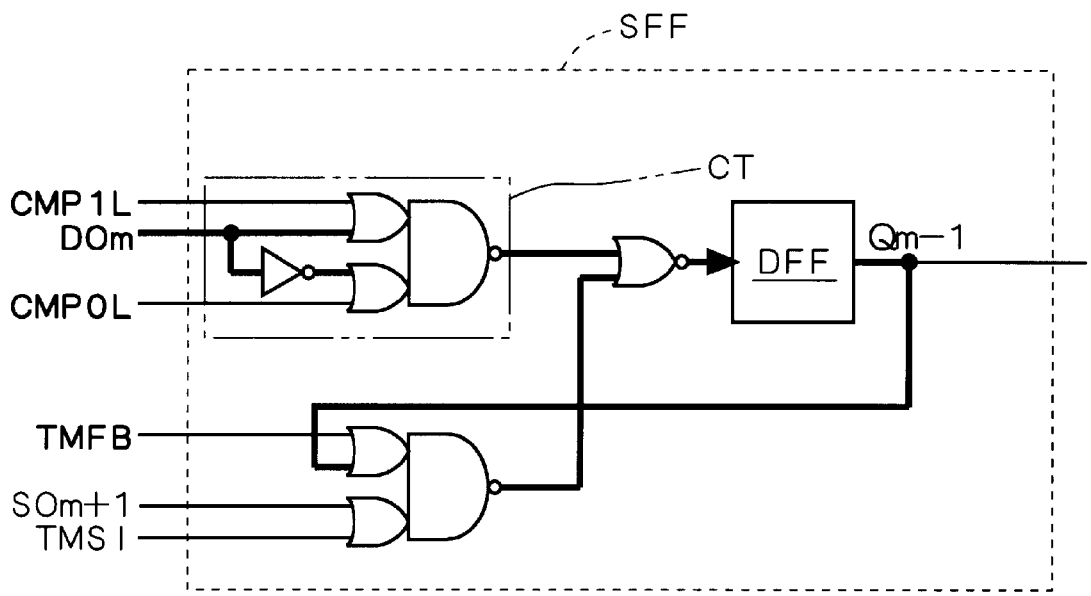
Figure 33:
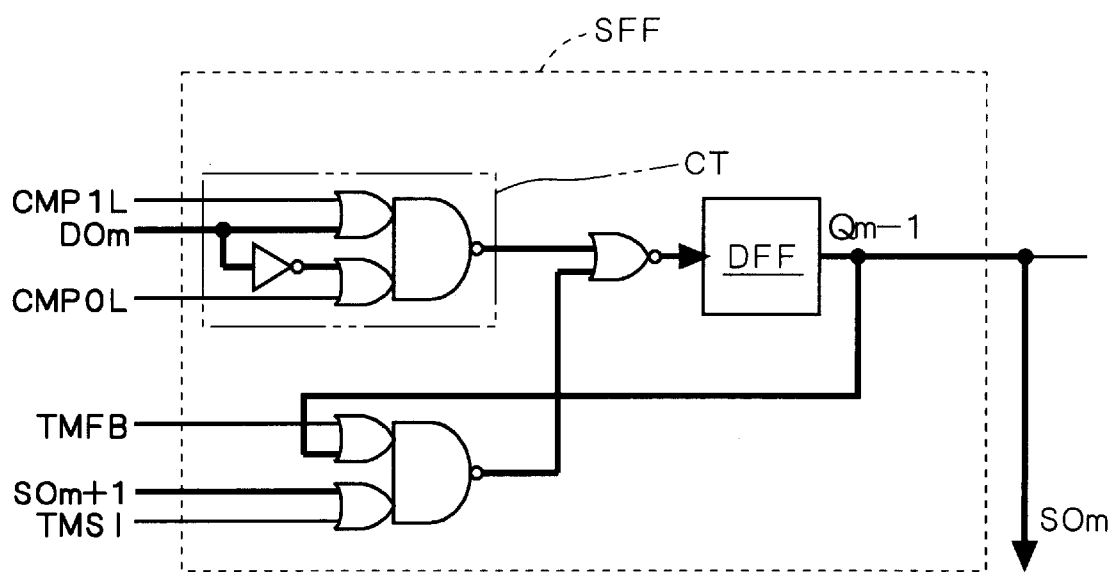

FIG. 27 is a circuit diagram of the scan path control circuit 211a. Its scan path flip flop circuit SFF is shown in FIG. 28. The scan path control signal S includes signals ANDSI, SM, TM, CMPA, EXPA, and EXPB. The scan path control circuit 211a converts these signals into signals TMSI, TMFB, CMP0L (CMP0LA, CMP0LB), and CMP1L (CMP1LA, CMP1LB) and outputs them to each of the scan path blocks SB. Here the signals CMP0LA and CMP1LA are applied to odd-numbered scan path blocks SB, and the signals CMP0LB and CMP1LB are applied to even-numbered scan path blocks SB. The truth table of these signals is shown in TABLEs 2 and 3.

TABLE 2

| Mode | SM | TM | CMP | EXPA | ANDSI | EXPB |
|---|---|---|---|---|---|---|
| Normal | 0 | 0 | 0 | 0 | 0 | 0 |
| Shift | 1 | 0 | 0 | 0 | 0 | 0 |
| Hold | 1 | 1 | 0 | 0 | 0 | 0 |
| Compare | 1 | 1 | 1 | expa | 0 | expb |
| Shifting Compare | 1 | 1 | 1 | expa | 1 | expb |

TABLE 3

| Mode | TMSI | TMFB | CMP0LA | CMP1LA | CMP0LB | CMP1LB |
|---|---|---|---|---|---|---|
| Normal | 1 | 1 | 1 | 0 | 1 | 0 |
| Shift | 0 | 1 | 1 | 1 | 1 | 1 |
| Hold | 1 | 0 | 1 | 1 | 1 | 1 |
| Shift | 1 | 0 | expa | $\overline{expa}$ | expb | $\overline{expb}$ |
| Shifting Compare | 0 | 0 | expa | $\overline{expa}$ | expb | $\overline{expb}$ |

The operations during the respective modes in TABLEs 2 and 3 are shown in FIGS. 29 through 33. The heavy line in those drawings with respect to FIG. 28 indicates a signal characterizing the mode. FIGS. 29 through 32 show the normal, shift, hold, and compare modes, respectively. The operation of each mode is as described in the first preferred embodiment.

In the fifth preferred embodiment, a shifting compare mode (cf. FIG. 33) is added. The shifting compare mode is a combination of the compare and shift modes. That is, if the signals SM, TM, CMP, and ANDSI are all set to "1", the device goes into the shifting compare mode. In the shifting compare mode, the D-type flip flop circuit DFF first holds the comparison result, as in the compare mode. If the D-type flip flop circuit DFF in the m-th scan path block SB holds "0", the value "0" is, as in the shift mode, transmitted to the scan path blocks SB in descending order starting at the (m−1)th scan path block. Accordingly, the D-type flip flop circuits DFF in the m-th through first scan path blocks SB hold "0".

Next, we will give a concrete example of how to use the scan path of the fifth preferred embodiment. First, all bits at every address in the RAM 100 are set to "1". In this case, all the bits of the data DO outputted from the RAM 100 should always be "1" unless a failure occurs in the RAM 100. However, for the convenience of description, assume herein that only the third bit at address 8 in the RAM 100 holds "0" due to a failure in the RAM 100 and the remaining bits hold "1" as intended.

Then, the device is placed in the shift mode so that the D-type flip flop circuits DFF in all the scan path flip flop circuits SFF hold "1".

After the signals EXPA an EXPB are set to "1", the device is placed in the shifting compare mode.

In the shifting compare mode, all the data DO in the RAM 100 are read out in ascending order of address starting at 0. Each bit of the data DO is transmitted to each of the scan path flip flop circuits SFF. Since all bits of the data DO at addresses from 0 through 7 are "1", each of the scan path flip flop circuits SFF still holds "1". However, with the data DO at address 8 whose third bit is "0", the value of the third D-type flip flop circuit DFF changes into "0" for example at the next rising edge of the clock T. Accordingly, the value of the second D-type flip flop circuit DFF changes into "0" at the next rising edge of the clock T and the value of the first D-type flip flop circuit DFF at the next rising edge of the clock T, whereby the serial data SS2 changes from "1" to "0". This indicates that there is a failure in the RAM 100.

In this fashion, a failure in the RAM 100 can be found before all the data DO in the RAM 100 is read out from all the addresses. This reduces time required for the test when compared to that required in the first preferred embodiment wherein a failure in the RAM 100 can be found only after all the data DO are read out.

The switch control signal SET may further be applied to the D-type flip flop circuit DFF in FIG. 28 as in FIG. 6. When the switch control signal SET is "1", the D-type flip flop circuit DFF forcefully rewrites the 1-bit data Qm−1 therein with "1". Thus, if the switch control signal SET satisfies a predetermined condition, data is outputted to a predetermined line of the data busses BO2 and BI2 (FIG. 1). This eliminates the need for determining a line to which data is transmitted according to the data, thus considerably facilitating the test of the logic circuit 300.

Sixth Preferred Embodiment

While c=b−1 in the first through fifth preferred embodiments, c<b−1 in a sixth preferred embodiment. More specifically, we will describe a case where c=6, b=8 and the shifting compare mode is adopted as described in the fifth preferred embodiment.

Figure 34:
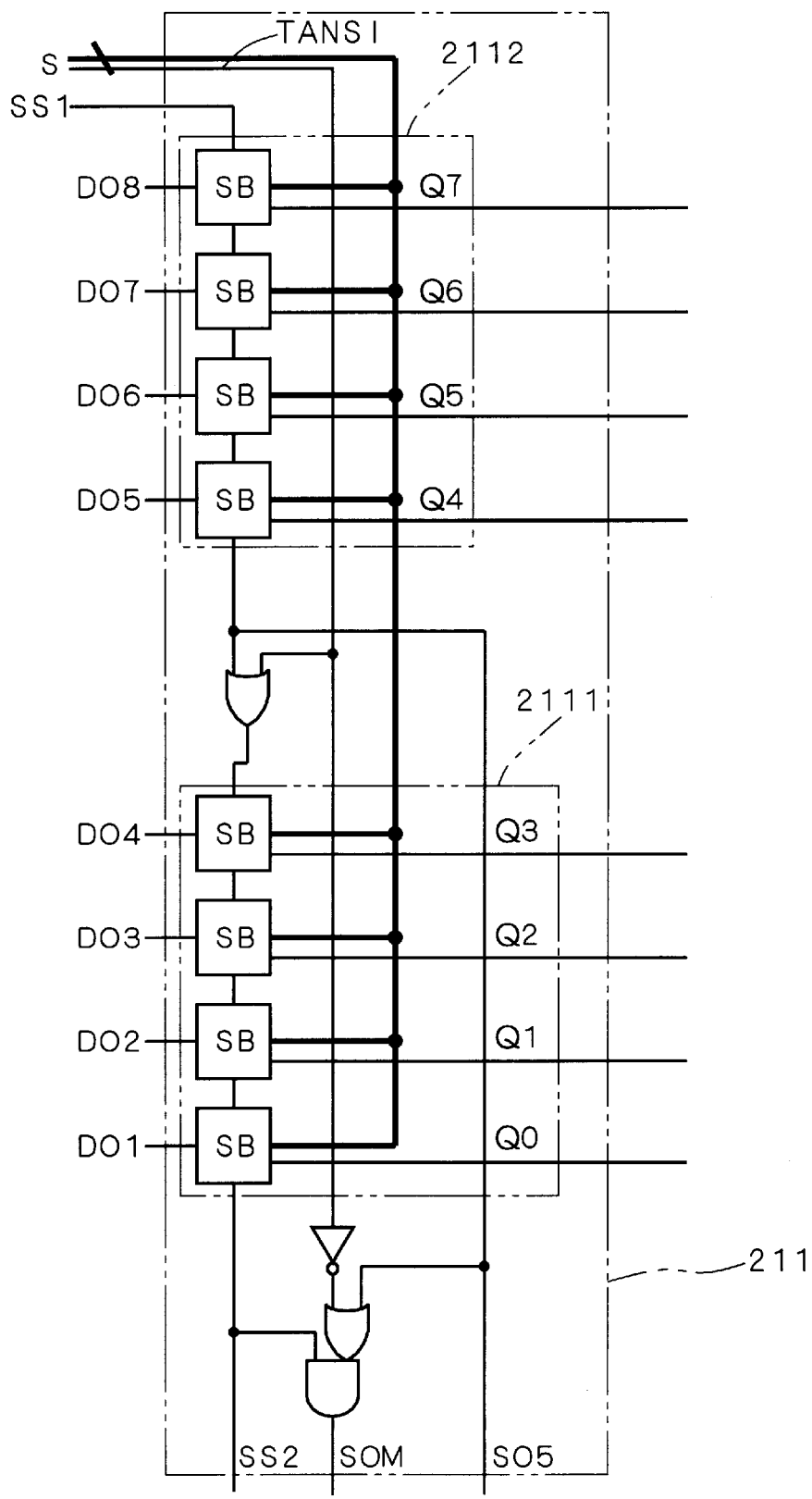
FIG. 34 is a circuit diagram of a scan path circuit according to a sixth preferred embodiment of the present invention.

FIG. 34 is another circuit diagram of the scan path circuit 211. The scan path circuit 211 in FIG. 34 includes a first scan path block 2111 consisting of first through fourth scan path blocks SB and a second scan path block 2112 consisting of fifth through eighth scan path blocks SB. The scan path control signal S includes a signal TANSI.

Figure 35:
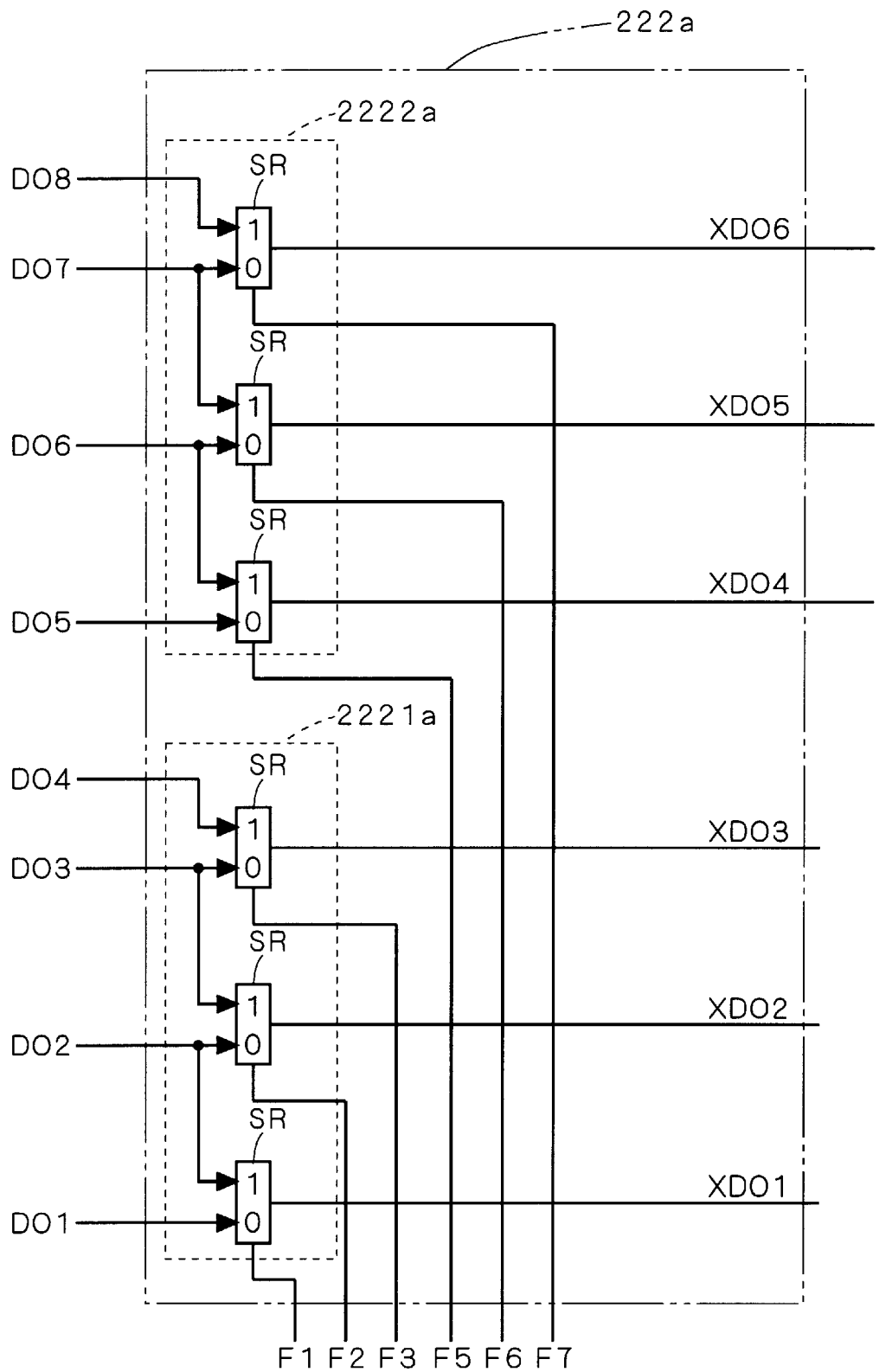
FIG. 35 is a circuit diagram of an output selector block according to the sixth preferred embodiment of the present invention.

FIG. 35 is another circuit diagram of the output selector block 222a. The output selector block 222a in FIG. 35 includes a first selector block 2221a consisting of three selectors SR and a second selector block 2222a consisting of three selectors SR.

Figure 36:
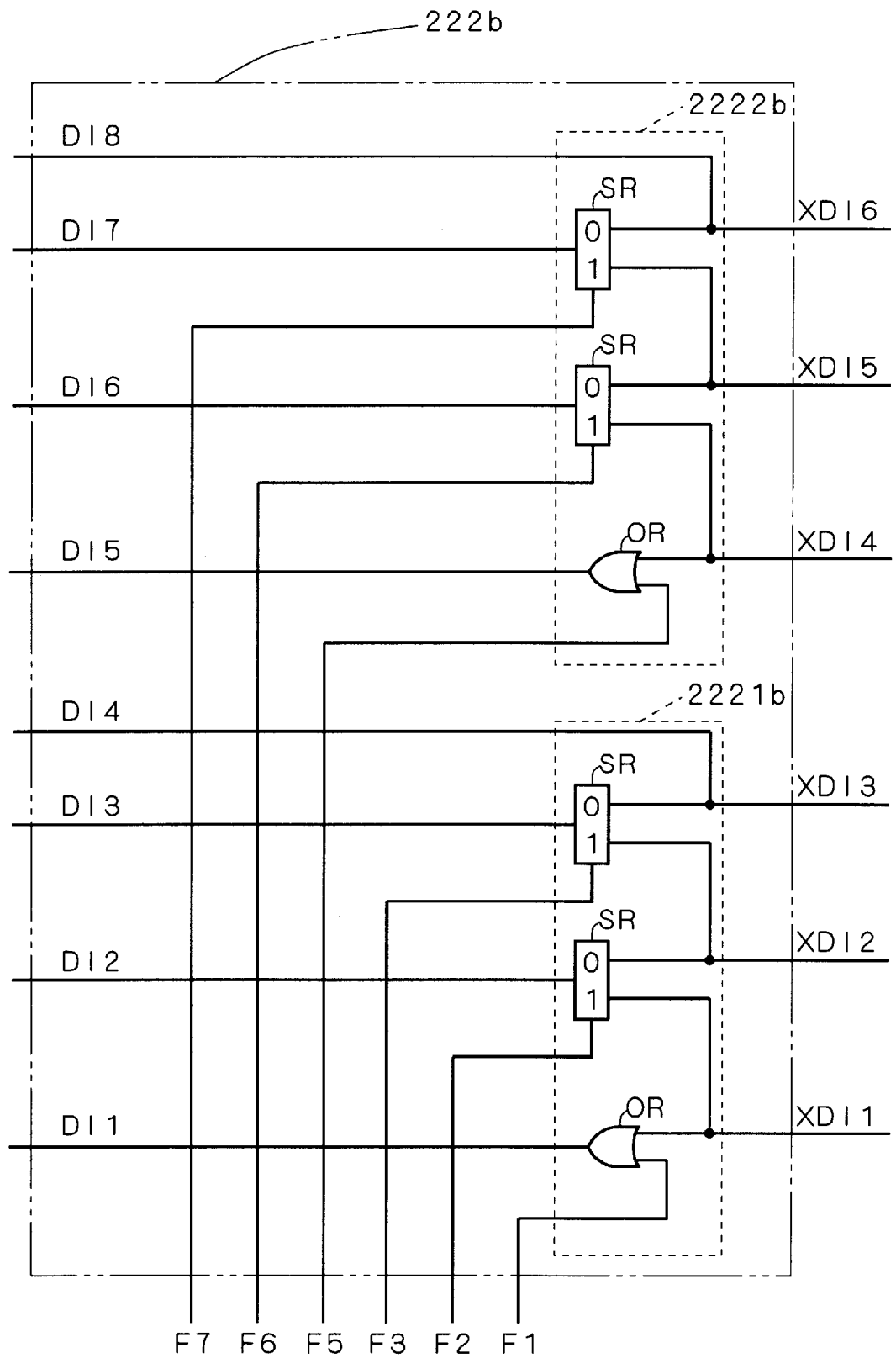
FIG. 36 is a circuit diagram of an input selector block according to the sixth preferred embodiment of the present invention.

FIG. 36 is another circuit diagram of the input selector block 222b. The input selector block 222b in FIG. 36 includes a first selector block 2221b consisting of two selectors SR and one OR circuit OR, and a second selector block 2222b consisting of two selectors SR and one OR circuit OR.

Next, we will give a concrete example of how to use the scan path of the sixth preferred embodiment. First, all bits at every address in the RAM 100 are set to "1". In this case, all the bits of the data DO outputted from the RAM should always be "1" unless a failure occurs in the RAM 100. However, for the convenience of description, assume herein that only the third bit at address 8 in the RAM 100 holds "0" due to a failure in the RAM 100 and the remaining bits hold "1" as intended.

Then, the signal TANSI is set to "0", whereby the eight scan path blocks SB are connected in series. In this state, the serial data SS1 is set to "1" and the device is placed in the shift mode so that the D-type flip flop circuits DFF in all the scan path blocks SB hold "1". Thereafter, the signal TANSI is set to "1".

After the signals EXPA and EXPB are set to "1", the device is placed in the shifting compare mode.

In the shifting compare mode, all the data DO in the RAM 100 are read out in ascending order of address starting at 0. Each bit of the data DO is transmitted to each of the scan path flip flop circuits SFF. Since all bits of the data DO at addresses from 0 through 7 are "1", each of the scan path flip flop circuits SFF still holds "1". However, with the data DO at address 8 whose third bit is "0", the value of the third D-type flip flop circuit DFF changes into "0" for example at the next rising edge of the clock T. Accordingly, the value of the second D-type flip flop circuit DFF changes into "0" at the next rising edge of the clock T, and the value of the first D-type flip flop circuit DFF at the next rising edge of the clock T, whereby the serial data SS2 changes from "1" to "0". This indicates that there is a failure in the RAM 100. Since the scan path circuit 211 is divided into the first and second scan path blocks 2111 and 2112, the shifting compare operation is performed independently in the respective first and second scan path blocks 2111 and 2112.

Since the third D-type flip flop circuit DFF holds "0", the selector control signals F1 and F2 in the selector control signal F are set to "0". Therefore, the output selector block 222a in FIG. 35 outputs the 1-bit data DO1 as XDO1, DO2 as XDO2, DO4 as XDO3, DO6 as XDO4, DO7 as XDO5, and DO8 as XDO6. The input selector block 222b in FIG. 36 outputs the 1-bit data XDI1 as DI1, XDI2 as DI2 and DI3, XDI3 as DI4, XDI4 as DI6, XDI5 as DI7, and XDI6 as DI8.

Next, the device is placed in the hold mode so that the data in the scan path blocks SB remain unchanged. In this fashion, the RAM 100 can be used as a 6-bit RAM excluding the third bit of trouble, and the switch 200 serves as a redundancy circuit for relieving the RAM 100 of its failures.

In the sixth preferred embodiment, a failure in the RAM 100 can be found before all the data DO in the RAM 100 are read out from the addresses. This reduces time required for the test when compared to that in the first preferred embodiment wherein a failure in the RAM 100 can be found only after all the data DO in the RAM 100 are read out. In addition, since 1-bit data SO5 from the fifth scan path block SB is immediately outputted as the 1-bit data SOM without passing through the first scan path block 2111, a failure in the RAM 100 can immediately be found even if any of the fifth through eighth bits of the RAM 100 is in error. This further reduces the time required for the test.

The idea of dividing each of the scan path circuit 211, the output selector block 222a, and the input selector block 222b into several blocks can be applied to the other preferred embodiments.

Seventh Preferred Embodiment

Figure 37:
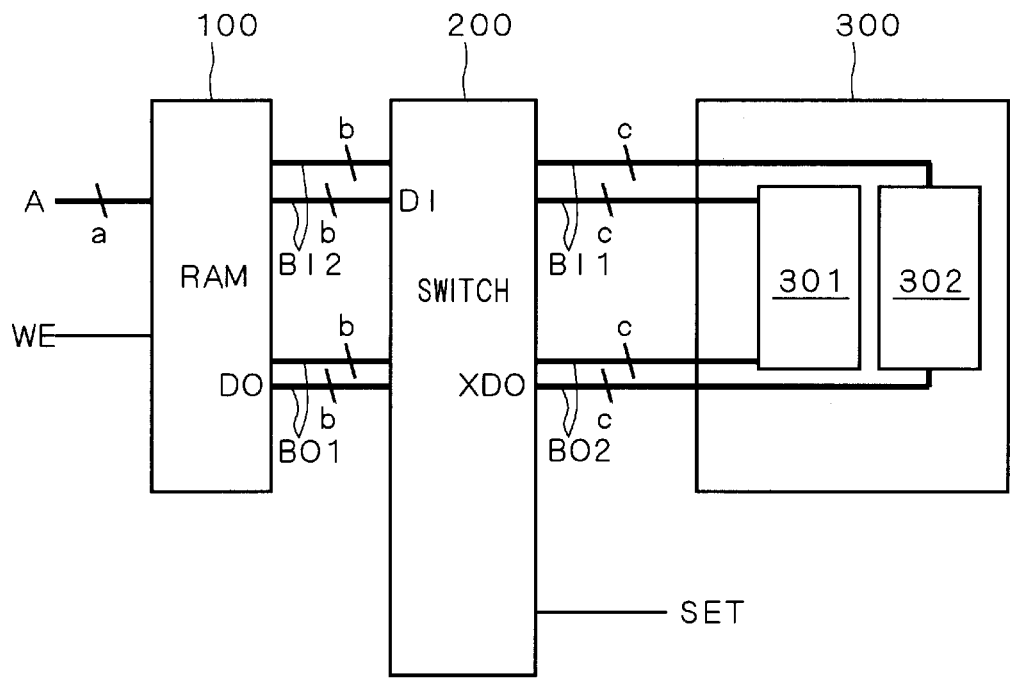
FIG. 37 is a circuit diagram of a semiconductor device according to a seventh preferred embodiment of the present invention.

FIG. 37 is another circuit diagram of the semiconductor device according to the present invention. In a seventh preferred embodiment, the switch 200 is a multi-port DRAM, i.e., it includes a plurality of ports (e.g., two in FIG. 37) for outputting the m-th 1-bit data DOm. We will now give a concrete description of such a switch 200 with two ports. Here 1-bit data DOm outputted from one of the two ports is referred to as DOam and 1-bit data DOm outputted from the other is referred to as DObm.

Figure 38:
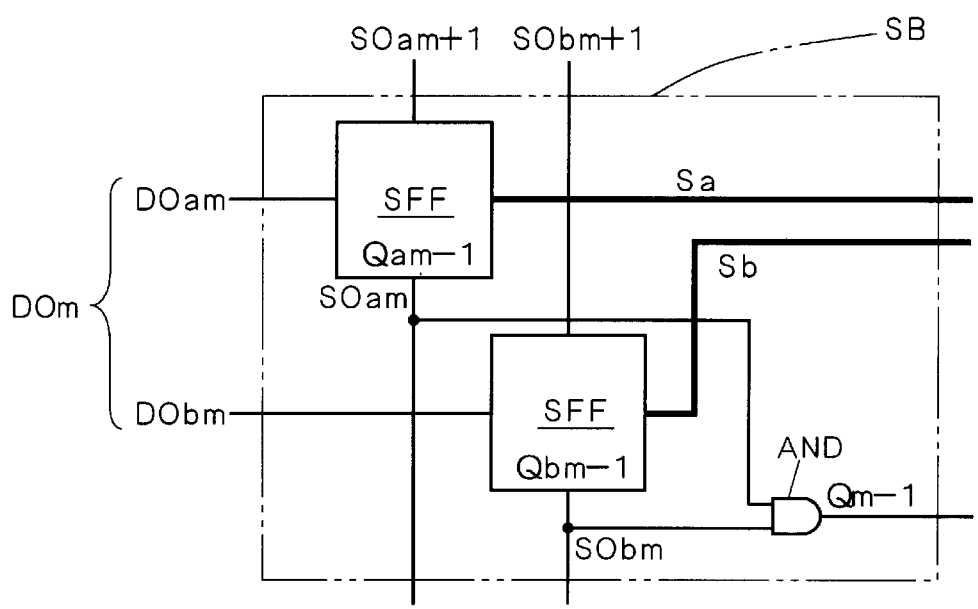
FIG. 38 is a circuit diagram of a scan path block according to the seventh preferred embodiment of the present invention.

FIG. 38 is a circuit diagram of the scan path block SB. The scan path block SB includes two scan path flip flop circuits SFF. One of the two scan path flip flop circuits SFF receives the 1-bit data DOam and the other receives the 1-bit data DObm.

In the scan path flip flop circuit SFF receiving the 1-bit data DOam, the 1-bit data SOm, SOm+1, and the scan path control signal S are referred to as SOam, SOam+1, and Sa, respectively.

In the scan path flip flop circuit SFF receiving the 1-bit data DObm, the 1-bit data SOm, SOm+1, and the scan path control signal S are referred to as SObm, SObm+1, and Sb, respectively.

Figure 39:
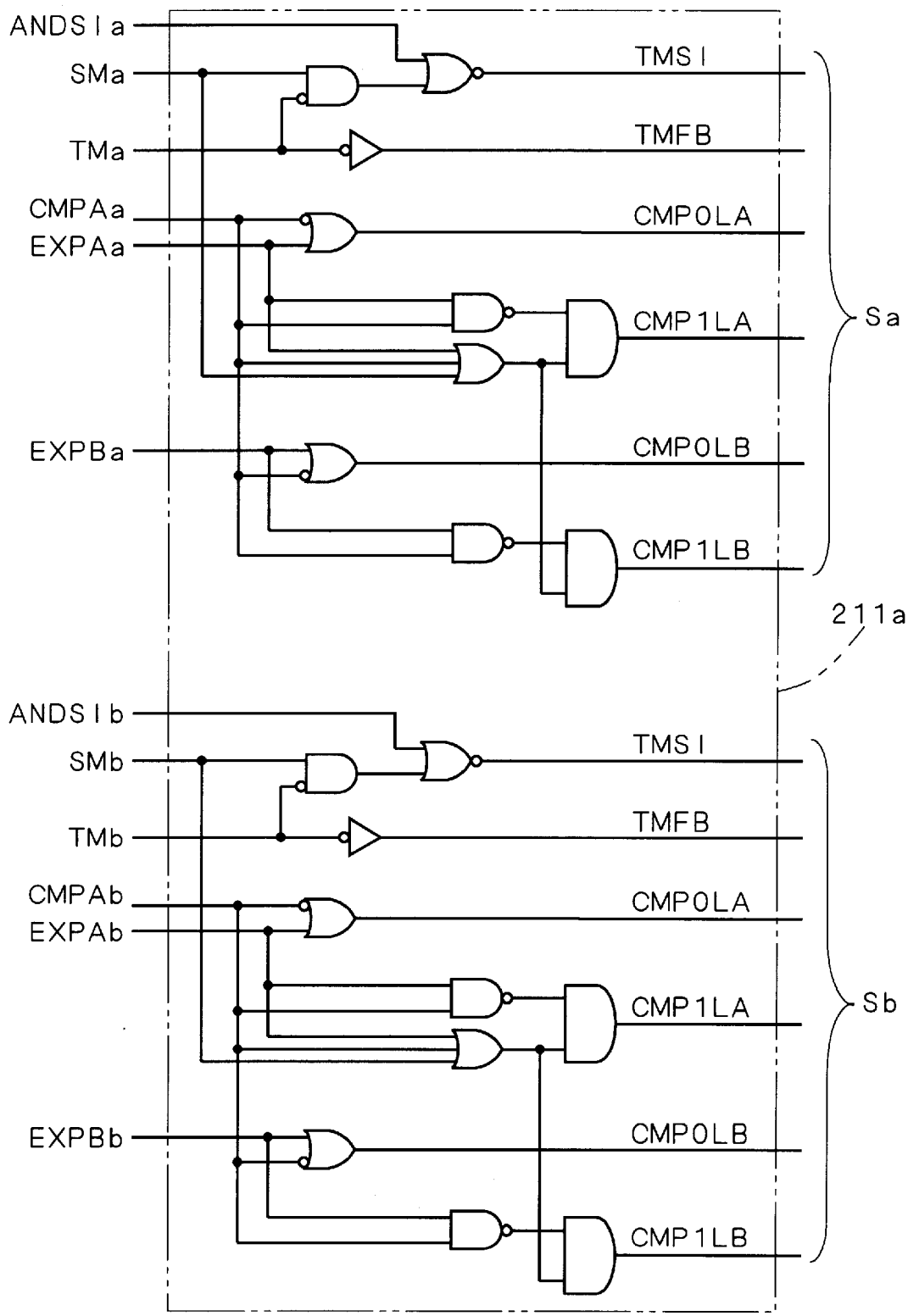
FIG. 39 is a circuit diagram of a selector control circuit according to the seventh preferred embodiment of the present invention.

FIG. 39 is a circuit diagram of the scan path control circuit 211a. This scan path control circuit 211a is a combination of two circuits in FIG. 27 for the respective scan path control signals Sa and Sb.

There are also provided two selector blocks 222.

In the multi-port DRAM, an error in any one of the 1-bit data DOam and DObm indicates a failure in the m-th bit. Thus, if any one of the 1-bit data DOam and DObm is different from the expected value, the m-th bit of the RAM 100 is unused, and the corresponding 1-bit data SOam or SObm becomes "0". Then, the AND circuit AND outputs a logical product of the 1-bit data SOam and SObm as Qm−1. Therefore, if any one of the 1-bit data DOam and DObm is in error, the switch 200 applied the data DOa and DOb, except the m-th bit of trouble, to the data bus BO2. This relieves the multi-port DRAM of its failures.

Eighth Preferred Embodiment

Figure 40:
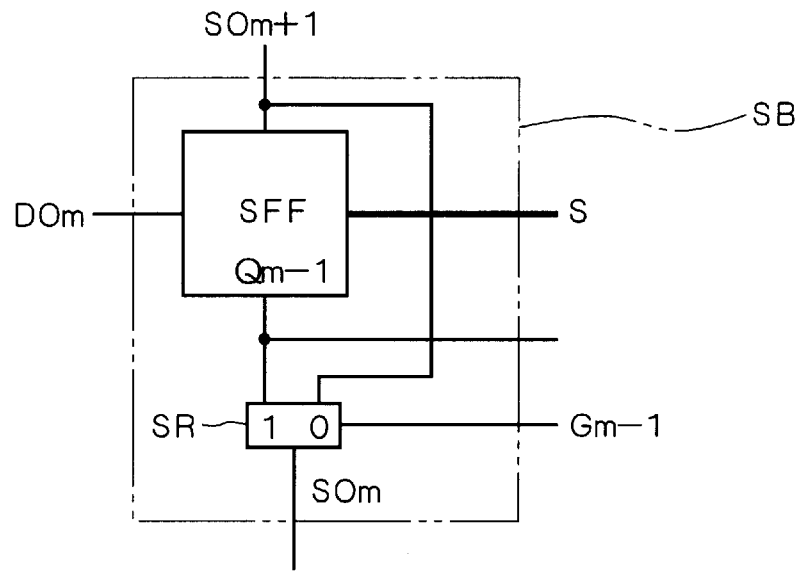
FIG. 40 is a circuit diagram of a scan path block according to an eighth preferred embodiment of the present invention.

FIG. 40 is another circuit diagram of the scan path block SB. The scan path block SB in FIG. 40 includes one scan path flip flop circuit SFF and one selector SR. The selector SR receives the 1-bit data Gm−1, the 1-bit data SOm+1 outputted from the ante-stage scan path block, and the 1-bit data Qm−1, and selects either one of the 1-bit data SOm+1 and Qm−1 according to the 1-bit data Gm−1 to output it as SOm to the post-stage scan path block.

We will now consider the case where the scan path block SB in FIG. 40 is applied to the second preferred embodiment. Assume for example that only the third D-type flip flop circuit DFF holds "0", whereby the register 212 outputs the 1-bit data G2 of "0".

After all the data DO in the RAM 100 are read out from all the addresses, the device is placed in the shift mode wherein the data held in the D-type flip flop circuits DFF are outputted as the serial data SS2.

Then, the device is again placed in the shift mode so that the D-type flip flop circuits DFF in all the scan path blocks hold "1". Here the 1-bit data G2 remains "0" and the selector SR in the scan path block SB outputs the 1-bit data SOm+1 as SOm. Therefore, this scan path is equivalent to the (b−1)-bit scan path, wherein the m-th scan path block SB is ignored and still holds the 1-bit data Qm−1 of "0".

After the signal EXP is set to "1", the device is placed in the compare mode.

In the compare mode, the data DO in the RAM 100 are read out in ascending order of address starting at 0. Each bit of the data DO is transmitted to each of the scan path flip flop circuits SFF.

After all the data DO in the RAM 100 are read out from all the addresses, the device is placed in the shift mode wherein the data held in the D-type flip flop circuits DFF are outputted as the serial data SS2. If the serial data SS2 includes "0" irrespective of the ignorance of the m-th scan path block SB, it is considered that two or more bits of the RAM 100 are in error, and thus, the RAM 100 cannot be relieved.

In this fashion, we can learn the impossibility of relieving the RAM 100 of its failures.

Ninth Preferred Embodiment

Figure 41:
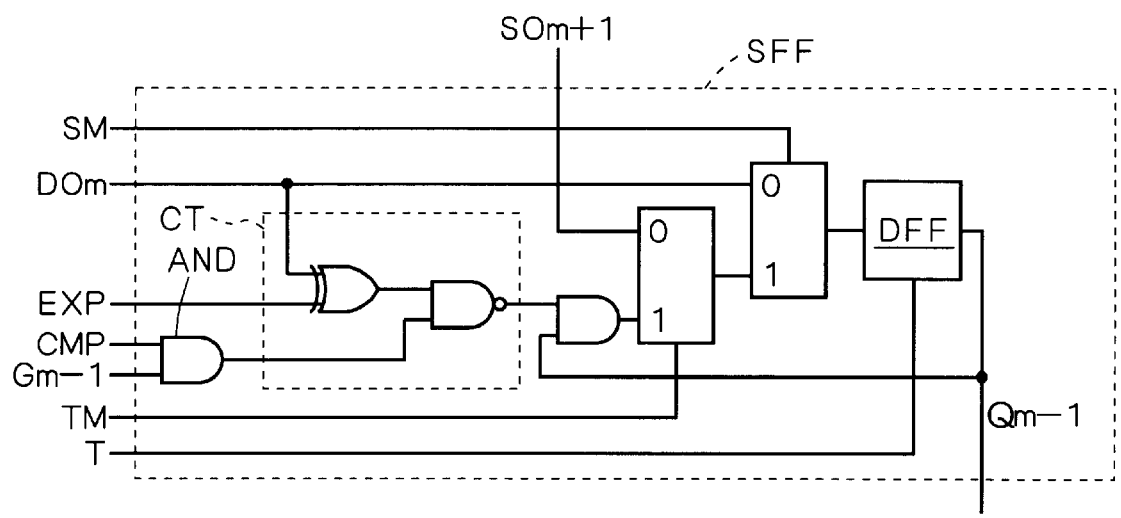
FIG. 41 is a circuit diagram of a scan path flip flop circuit according to a ninth preferred embodiment of the present invention.

FIG. 41 is another circuit diagram of the scan path flip flop circuit SFF. The scan path flip flop circuit SFF in FIG. 41 further includes an AND circuit AND for changing the comparison result into a predetermined value on the basis of the 1-bit data Gm−1.

We will now consider the case where the scan path block SB in FIG. 41 is applied to the second preferred embodiment. Assume for example that only the third D-type flip flop circuit DFF holds "0", whereby the register 212 outputs the 1-bit data G2 of After all the data DO in the RAM 100 are read out from all the addresses, the device is placed in the shift mode wherein the data held in the D-type flip flop circuits DFF are outputted as the serial data SS2.

Then, the device is again placed in the shift mode so that the D-type flip flop circuits DFF in all the scan path blocks SB hold "1".

After the signal EXP is set to "1", the device is placed in the compare mode.

In the compare mode, the data DO in the RAM 100 are read out in ascending order of address starting at 0. Each bit of the data DO is transmitted to each of the scan path flip flop circuits SFF. Since the 1-bit data G2 is "0", only the third scan path block SB are brought into the same state as it is in the hold mode. Accordingly, the third scan path block SB remains "1".

After all the data DO in the RAM 100 are read out from all the addresses, the device is placed in the shift mode wherein the data held in the D-type flip flop circuits DFF are outputted as the serial data SS2. The value "0" in the serial data SS2 indicates that two or more bits of the RAM 100 are in error, so the RAM 100 cannot be relieved.

In this fashion, we can learn the impossibility of relieving the RAM 100 of its failures.

Tenth Preferred Embodiment

Figure 42:
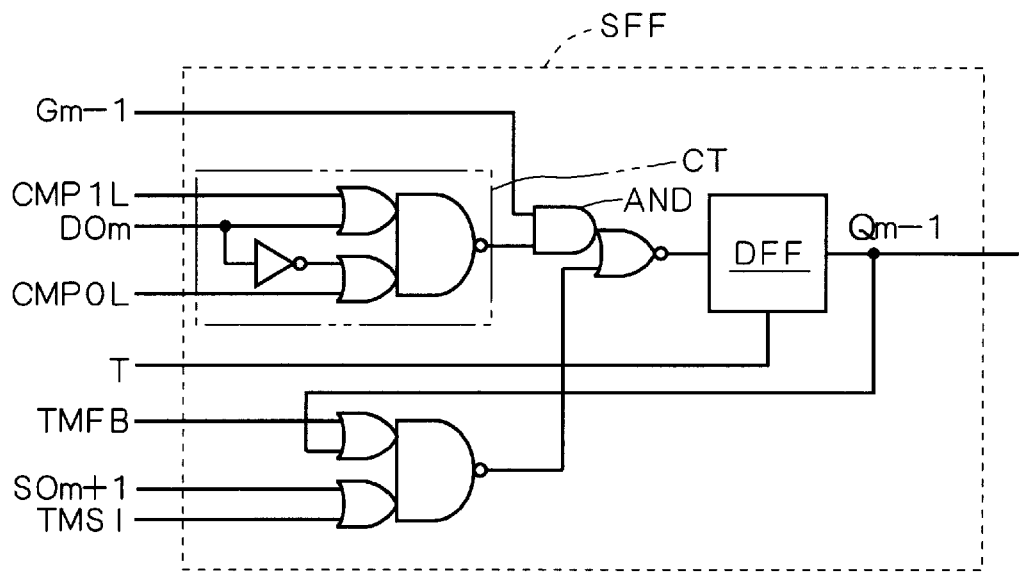
FIG. 42 is a circuit diagram of a scan path flip flop circuit according to a tenth preferred embodiment of the present invention.

FIG. 42 is another circuit diagram of the scan path flip flop circuit SFF. The scan path flip flop circuit SFF in FIG. 42 further includes an AND circuit AND for changing the comparison result into a predetermined value on the basis of the 1-bit data Gm−1.

We will now consider the case where the scan path block SB in FIG. 42 is applied to the second preferred embodiment. Assume for example that only the third D-type flip flop circuit DFF holds "0", whereby the register 212 outputs the 1-bit data G2 of "0".

After all the data Do in the RAM 100 are read out from all the addresses, the device is placed in the shift mode wherein the data held in the D-type flip flop circuits DFF are outputted as the serial data SS2.

Then, the device is again placed in the shift mode so that the D-type flip flop circuits DFF in all the scan path blocks SB hold "1".

After the signals EXPA and EXPB are set to "1", the device is placed in the shifting compare mode.

In the shifting compare mode, the data DO in the RAM 100 are read out in ascending order of address starting at 0. Each bit of the data DO is transmitted to each of the scan path flip flop circuits SFF. Since the 1-bit data G2 is "0", the third scan path block SB holds "1" independently of the comparison result. Then, the D-type flip flop circuits DFF output the data therein as the serial data SS2. The value "0" in the serial data SS2 indicates that two or more bits of the RAM 100 are in error, so the RAM 100 cannot be relieved.

In this fashion, we can learn the impossibility of relieving the RAM 100 of its failures.

Eleventh Preferred Embodiment

Figure 43:
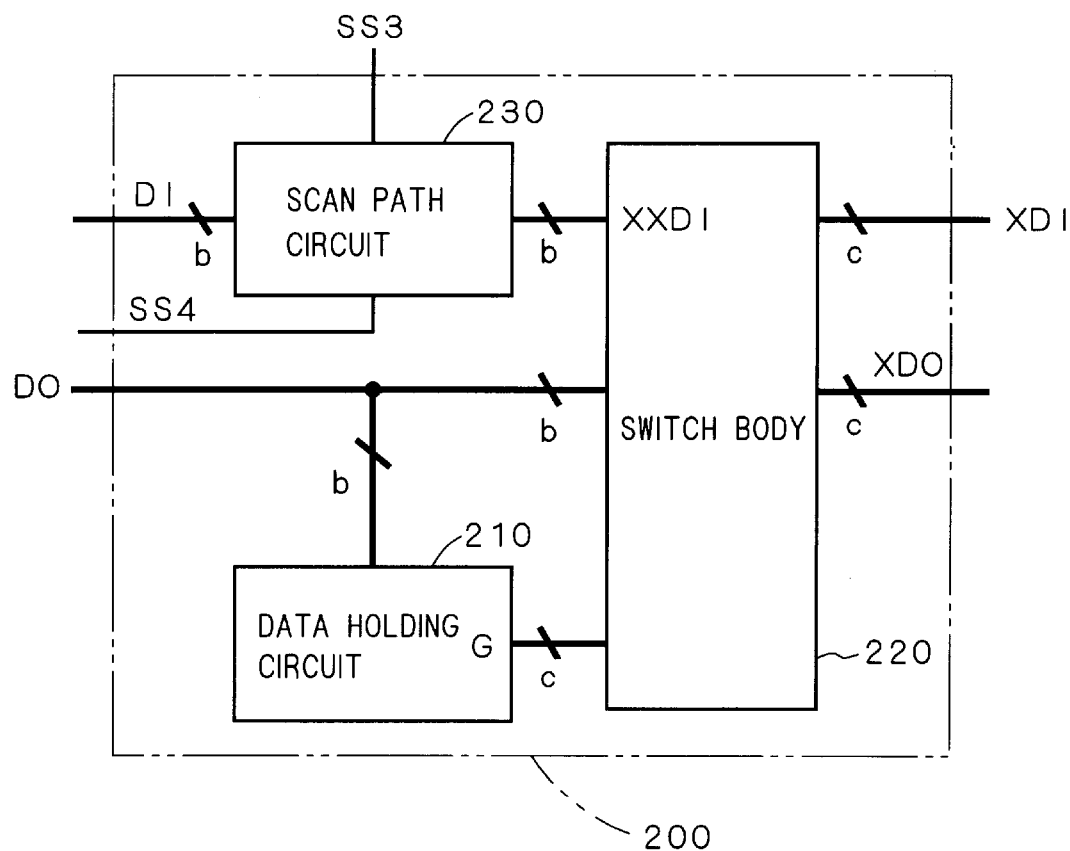
FIG. 43 is a circuit diagram of a switch according to an eleventh preferred embodiment of the present invention.

FIG. 43 is another circuit diagram of the switch 200. The switch 200 in an eleventh preferred embodiment further includes a scan path circuit 230.

Figure 44:
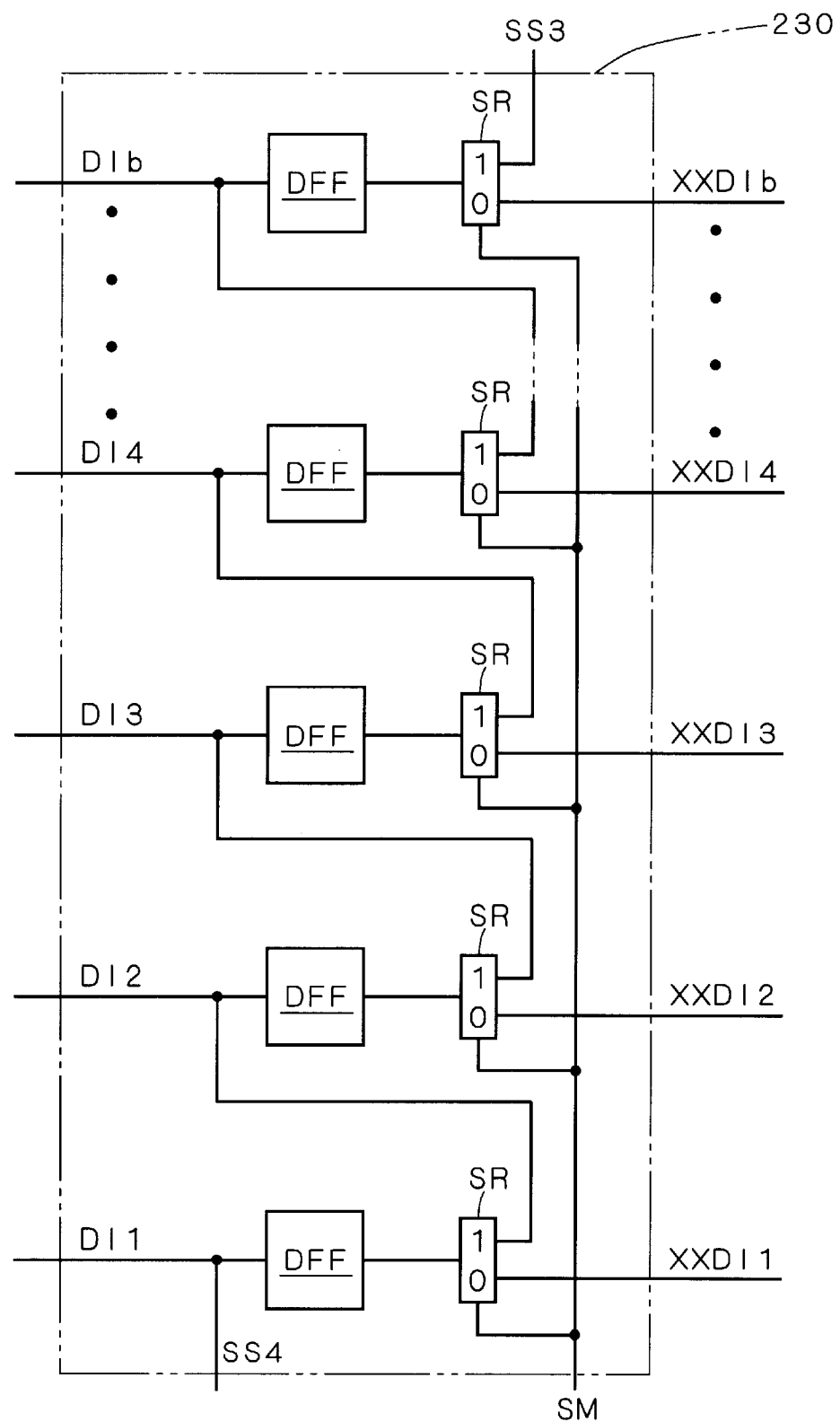
FIGS. 44 through 46 are circuit diagrams of scan path circuits according to the eleventh preferred embodiment of the present invention.

FIG. 44 is a circuit diagram of the scan path circuit 230. The scan path circuit 230 includes b selectors SR and b D-type flip flop circuits DFF. The m-th (herein m=1, 2, . . . , b) selector SR receives the 1-bit data XXDIm, an output signal from the (m+1)th D-type flip flop circuit DFF, and the signal SM. The m-th D-type flip flop circuit DFF receives an output signal from the m-th selector SR and outputs the 1-bit data DIm.

Figure 45:
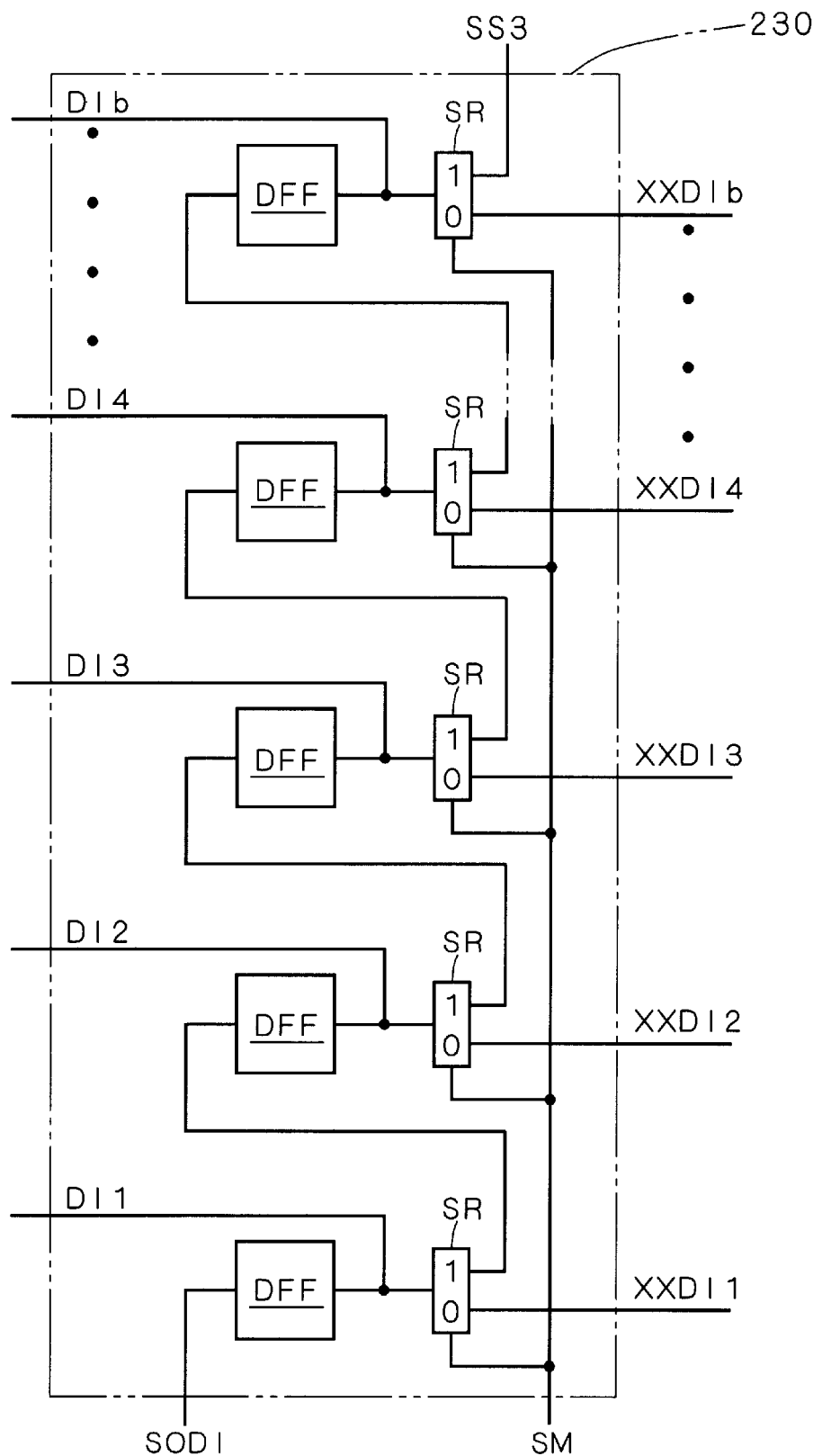

The scan path circuit 230 may alternatively be configured as shown in FIG. 45. In FIG. 45, the output signal from the m-th selector SR is the 1-bit data DIm.

As shown in FIGS. 44 and 45, when the signal SM is "0", the 1-bit data XXDIm is the 1-bit data DIm and held in the m-th D-type flip flop circuit DFF. When the signal SM is "1", on the other hand, serial data SS3 are set to each of the b D-type flip flop circuits DFF and the data held in the b D-type flip flop circuits DFF are outputted as serial data SS4.

Figure 46:
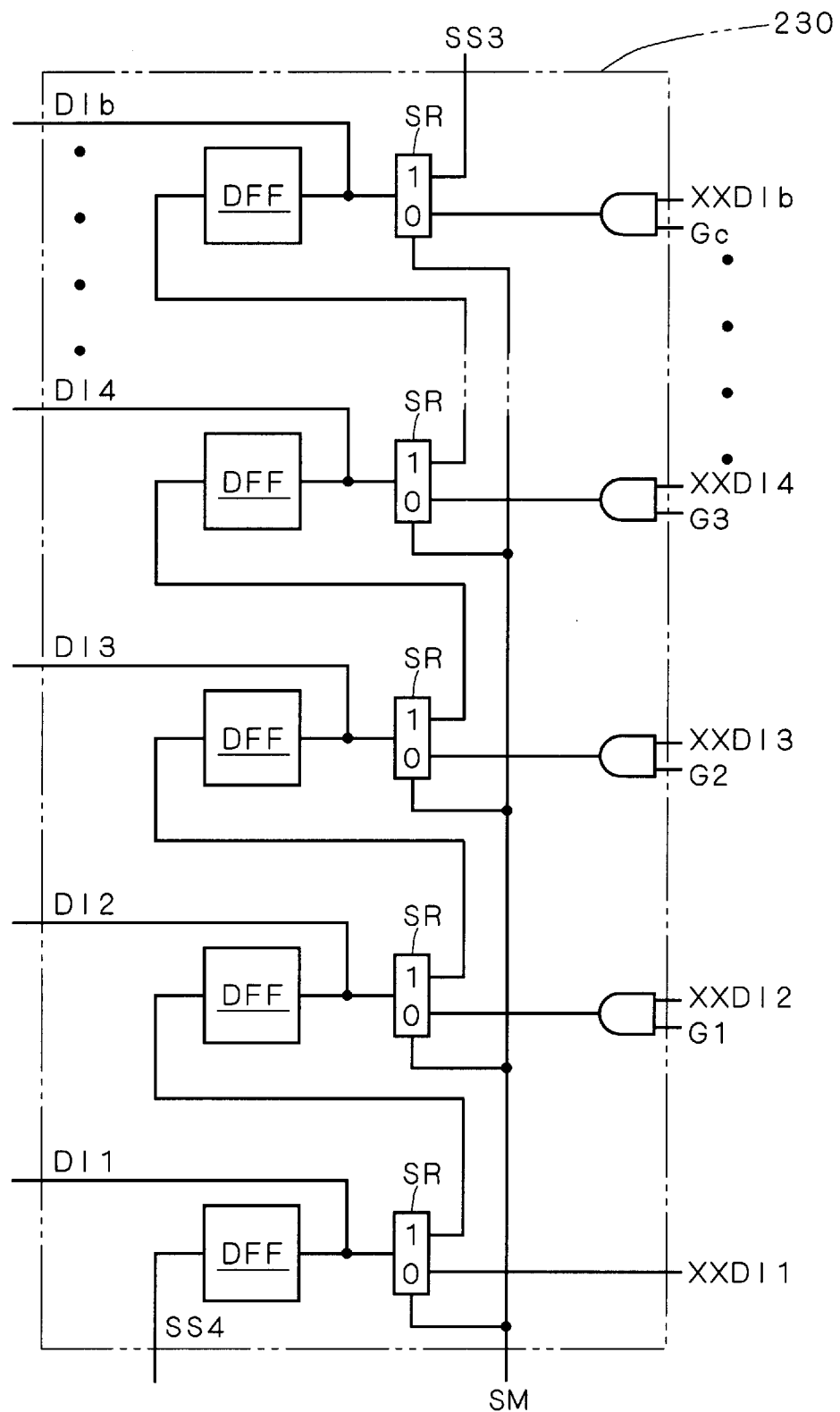
Figure 47:
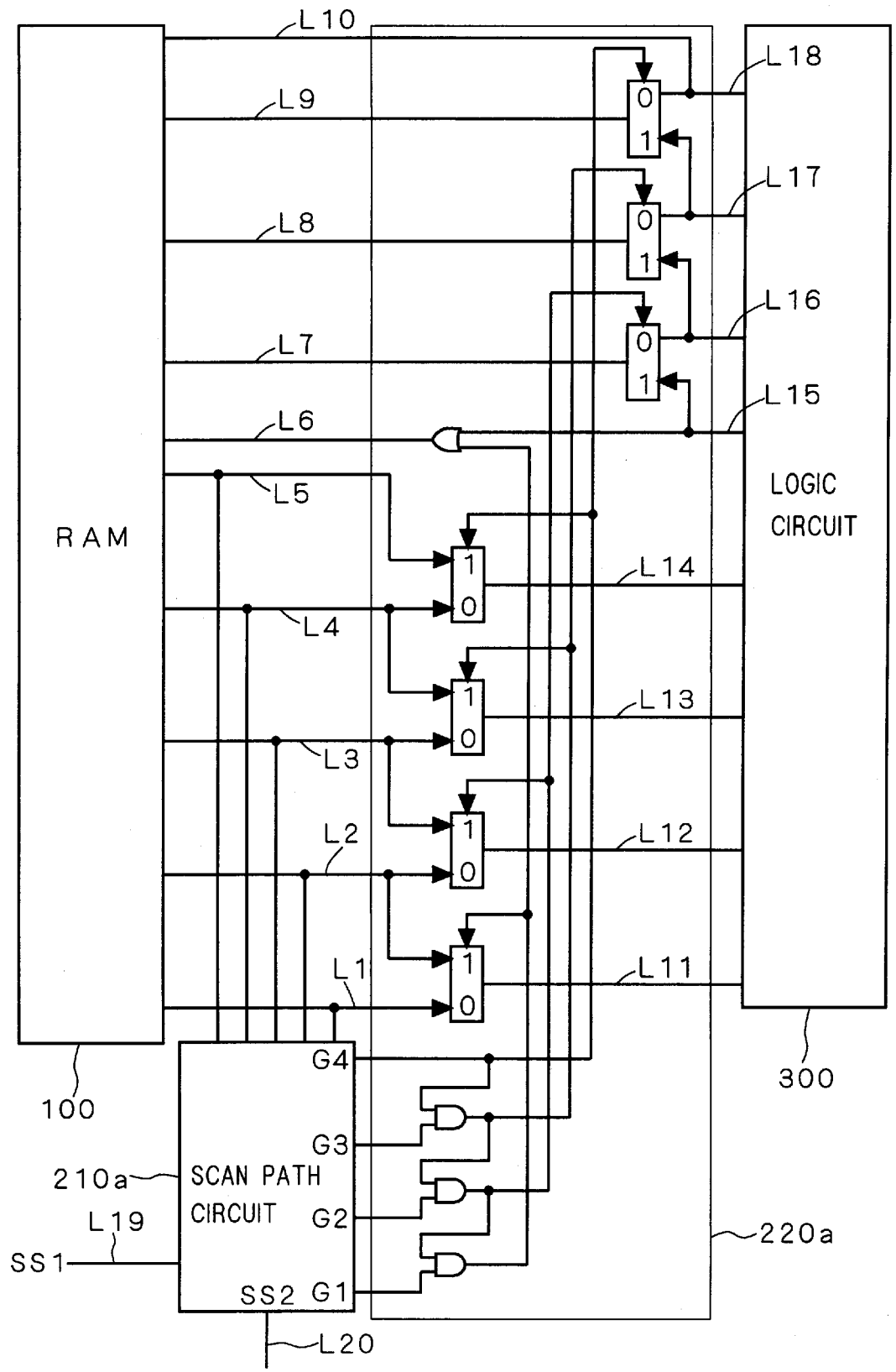
FIG. 47 is a circuit diagram of a conventional semiconductor device.

Instead of the configurations in FIGS. 44 and 45, the scan path circuit 230 may alternatively be configured as shown in FIG. 46, wherein a logical sum of the 1-bit data XXDIm and Gm−1 is outputted to the m-th selector. In this case, if there is a failure in the third bit of the RAM 100, the 1-bit data G2 becomes "0". Thus, even if the 1-bit data XXDI3 changes when the signal SM is "1", the third selector SR constantly outputs "0". This allows the 1-bit data DI3, which is not used due to a failure in the RAM 100, to be fixed constantly at "0", thereby reducing power consumption in the RAM 100.

Variant Embodiment

The aforementioned first through eleventh preferred embodiments can be combined through proper selection.

The memory circuit may alternatively be a mask ROM or an EEPROM instead of the RAM.

When the register 212 is provided, it may control the switch body 220 independently of the data held in the scan path circuit 211. Correspondingly, the data DO from the RAM 100 may be applied to the switch body 220 through the scan path circuit 211 which does not have to control the switch body 220. In FIG. 10, for example, if the 1-bit data DOm (herein m=1, 2, . . . , b) applied to the selector SR is replaced by the 1-bit data Qm−1 outputted from the scan path circuit 211, the logic circuit 300 can be tested using the data DO from the RAM 100 and the serial data SS1 from an external terminal (not shown). That is, while the switch 200 in the first preferred embodiment selects and outputs the data DO outputted from the RAM 100, it may select and output the data Q outputted from the scan path circuit 211. In the combination of this variant embodiment and the first preferred embodiment, the switch 200 selects predetermined 1-bit data from the data DO and the serial data SS1 or 1-bit data corresponding to the data held in the data holding circuit 210, and outputs the selected data in parallel form. Here the number (=c) of selected 1-bit data is smaller than the number (=b) of bits of the data DO from the RAM 100.

While the register 212 shown does not hold the 1-bit data Q0, if necessary, it may be configured to hold the 1-bit data Q0 as well as Q1, Q2 . . .

The predetermined conditions for outputting data to a predetermined line is not limited only to the condition described above, but may be any other condition.

In the foregoing description, the signal transmission path is composed of only lines, but it may include other circuits such as a register, a capacitor, and a transistor as long as it is a path for transmitting data.

The semiconductor device according to the present invention only have to comprise at least the switch 200 out of the RAM 100, the switch 200, and the logic circuit 300. For example, the RAM 100 and the switch 200 may be formed on different chips, wherein at least the data bus BO1 is exposed on the chip so that the data DO transmitted over the data bus BO1 can easily be read out using a tester for example. In addition, if there is no harm, the scan path circuit may be omitted.

The switch can be applied to circuits other than the redundancy circuit of the RAM 100. In this case, the scan path circuit does not have to be built in the switch and may be provided outside the switch as long as it is formed on the same chip as the switch and the plurality of first and second signal transmission paths.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:

a memory circuit outputting N-bit data (N≧2) in a parallel form;

a switch including a data holding circuit having a scan path circuit receiving and holding said N-bit data from said memory circuit, said switch receiving a switch control signal and selecting and outputting M-bit data (M<N) from said N-bit data of said memory circuit, said M-bit data outputted from said switch being predetermined M-bit data out of said N-bit data from the memory circuit if said switch control signal satisfies a predetermined condition, and M-bit data being determined according to data held in said data holding circuit if said switch control signal does not satisfy said predetermined condition; and a logic circuit to be tested, receiving said M-bit data outputted from said switch, said predetermined M-bit data outputted from said switch being selected independently of data received from said memory circuit and said logic circuit when said switch control signal satisfies the predetermined condition.

2. The semiconductor device in accordance with claim 1, wherein said switch selects and outputs M-bit data directly outputted from said memory circuit.

3. The semiconductor device in accordance with claim 1, wherein said switch selects and outputs M-bit data in said scan path circuit from said memory circuit.

4. The semiconductor device in accordance with claim 1, wherein said switch further includes a selector block for selecting and outputting M-bit data from said memory circuit if said switch control signal satisfies said predetermined condition and for selecting and outputting M-bit data from said scan path circuit if said switch control signal does not satisfy said predetermined condition.

5. The semiconductor device in accordance with claim 1, wherein said data holding circuit further includes a register for holding data outputted from said scan path circuit.

6. The semiconductor device in accordance with claim 5, wherein if said switch control signal satisfies said predetermined condition, said register resets data held therein with a predetermined value.

7. The semiconductor device in accordance with claim 1, wherein said scan path circuit includes a plurality of series-connected scan path blocks, each of said plurality of scan path blocks having a comparator and receiving 1-bit data from expected data and resetting data held therein with a predetermined value according to a comparison result between said 1-bit data from said expected data and said 1-bit data from said memory circuit.

8. The semiconductor device in accordance with claim 7, wherein each of said plurality of scan path blocks resets data held therein with another predetermined value, if said switch control signal satisfies said predetermined condition.

9. The semiconductor device in accordance with claim 7, wherein each of said plurality of scan path blocks includes a selector for selecting either 1-bit data held therein or serial data from an ante-stage scan path block and for outputting the selected dada to a post-stage scan path block.

10. The semiconductor device in accordance with claim 7, wherein said data holding circuit further includes a register for holding data outputted from said scan path circuit;

each of said plurality of scan path blocks changes said comparison result into a predetermined value according to 1-bit data from said register.

* * * * *